(12) United States Patent
Osawa et al.

(10) Patent No.: US 7,086,600 B2
(45) Date of Patent: Aug. 8, 2006

(54) ELECTRONIC DEVICE AND METHOD OF MANUFACTURING THE SAME

(75) Inventors: Takahiro Osawa, Kodaira (JP); Yoichi Kawata, Higashiyamato (JP); Atsushi Fujishima, Kodaira (JP); Tamaki Wada, Higashimurayama (JP); Kenichi Imura, Higashiyamato (JP)

(73) Assignees: Renesas Technology Corporation, Tokyo (JP); Hitachi ULSI Systems Co., Ltd., Tokyo (JP)

( * ) Notice: Subject to any disclaimer, the term of this patent is extended or adjusted under 35 U.S.C. 154(b) by 0 days.

(21) Appl. No.: 10/466,428

(22) PCT Filed: Feb. 2, 2001

(86) PCT No.: PCT/JP01/00775

§ 371 (c)(1),
(2), (4) Date: Jul. 16, 2003

(87) PCT Pub. No.: WO02/062588

PCT Pub. Date: Aug. 15, 2002

(65) Prior Publication Data

US 2004/0056104 A1 Mar. 25, 2004

(51) Int. Cl.
*G06K 19/06* (2006.01)
*G06K 19/00* (2006.01)

(52) U.S. Cl. .................................. 235/492; 235/487
(58) Field of Classification Search ......... 235/487–488, 235/492
See application file for complete search history.

(56) References Cited

U.S. PATENT DOCUMENTS 6,051,877 A * 4/2000 Usami et al. ............... 257/679
6,591,494 B1 * 7/2003 Okamura et al. ............. 29/832
2001/0025721 A1 * 10/2001 Maeda et al. ............... 174/250

FOREIGN PATENT DOCUMENTS

| JP | 3-254994 | 3/1990 |
|----|----------|--------|
| JP | 5-246186 | 3/1992 |
| JP | 6-106887 | 9/1992 |
| JP | 6-216305 | 1/1993 |
| JP | 8-156470 | 11/1994 |
| JP | 11-11067 | 12/1997 |
| JP | 11-163256 | 12/1997 |
| JP | 11-45959 | 2/1998 |
| JP | 2000-48161 | 7/1998 |
| JP | 2000-236043 | 2/1999 |

* cited by examiner

*Primary Examiner*—Thien M. Le
*Assistant Examiner*—April Taylor
(74) *Attorney, Agent, or Firm*—Reed Smith LLP; Stanley P. Fisher, Esq.; Juan Carlos A. Marquez, Esq.

(57) ABSTRACT

A memory card wherein a substrate is affixed to a cap is formed without the projection of substrate edges from a back surface of the cap. The memory card includes a substrate having a sealing member bonded to a recess in the cap. By utilizing a difference in thermal expansion coefficient between the sealing member and the substrate, the substrate is warped so that its central portion projects away from the cap. The shallow recess is deeper than the sum of the thickness of the substrate and the thickness of an adhesive for bonding the substrate to the bottom of the shallow recess, whereby peripheral edges of the substrate retract into the shallow recess without projecting from the back surface of the cap. The cap is shaped as a card several millimeters thick. A memory chip and control chip are incorporated in the sealing member.

49 Claims, 20 Drawing Sheets

FIG.6

|  | 0.0 | 0.5 | 1.0 | 1.5 | 2.0 | ... | 10.0 | 10.5 | 11.0 | 11.5 | 12.0 | ... | 22.0 | 22.5 | 23.0 | 23.5 |
|---|---|---|---|---|---|---|---|---|---|---|---|---|---|---|---|---|
| 0 | 1.3 | 1.3 | 1.3 | 1.3 | 1.3 | | 1.373 | 1.368 | 1.369 | 1.377 | 1.371 | | 1.326 | 1.335 | 1.327 | 1.327 |
| 0.5 | 1.3 | 1.3 | 1.3 | 1.3 | 1.3 | | 1.374 | 1.366 | 1.368 | 1.377 | 1.370 | | 1.324 | 1.334 | 1.327 | 1.327 |
| 1 | 1.3 | 1.3 | 1.3 | 1.3 | 1.3 | | 0.977 | 0.977 | 0.977 | 0.977 | 0.977 | | 0.977 | 0.977 | 1.353 | 1.355 |
| 1.5 | 1.3 | 1.3 | 1.3 | 1.3 | 1.3 | | 1.335 | 1.332 | 1.354 | 1.357 | 1.330 | | 1.295 | 1.295 | 1.332 | 1.334 |
| 2 | 1.3 | 1.3 | 1.3 | 1.3 | 1.381 | | 1.337 | 1.339 | 1.362 | 1.364 | 1.333 | | 1.295 | 1.295 | 1.339 | 1.338 |
| 2.5 | 1.3 | 1.3 | 1.3 | 1.387 | 1.380 | | 1.342 | 1.340 | 1.368 | 1.369 | 1.338 | | 1.295 | 1.295 | 1.340 | 1.339 |
| 3 | 1.3 | 1.3 | 1.388 | 1.385 | 1.255 | | 1.346 | 1.348 | 1.373 | 1.375 | 1.345 | | 1.296 | 1.295 | 1.325 | 1.325 |
| 3.5 | 1.3 | 1.379 | 1.386 | 1.281 | 1.365 | | 1.355 | 1.352 | 1.378 | 1.379 | 1.350 | | 1.299 | 1.296 | 1.333 | 1.333 |
| 4 | 1.379 | 1.378 | 0.977 | 1.368 | 1.369 | | 1.357 | 1.357 | 1.381 | 1.383 | 1.355 | | 1.302 | 1.298 | 1.340 | 1.339 |
| ... | | | | | | | | | | | | | | | | |
| 16.5 | 1.385 | 1.383 | 0.977 | 1.443 | 1.452 | | 1.486 | 1.486 | 1.484 | 1.484 | 1.480 | | 1.347 | 1.337 | 1.361 | 1.361 |
| 17 | 1.389 | 1.389 | 0.980 | 1.442 | 1.452 | | 1.490 | 1.490 | 1.489 | 1.486 | 1.486 | | 1.347 | 1.338 | 1.355 | 1.354 |
| 17.5 | 1.386 | 1.350 | 0.960 | 1.441 | 1.450 | | 1.490 | 1.490 | 1.491 | 1.490 | 1.487 | | 1.347 | 1.338 | 1.353 | 1.353 |
| 18 | 1.386 | 1.399 | 0.977 | 1.439 | 1.449 | | 1.490 | 1.490 | 1.490 | 1.492 | 1.491 | | 1.346 | 1.337 | 1.354 | 1.355 |
| 18.5 | 1.390 | 1.399 | 0.980 | 1.436 | 1.447 | | 1.490 | 1.490 | 1.491 | 1.490 | 1.490 | | 1.345 | 1.335 | 1.352 | 1.352 |
| ... | | | | | | | | | | | | | | | | |
| 28 | 1.353 | 1.363 | 0.977 | 1.350 | 1.362 | | 1.395 | 1.395 | 1.394 | 1.397 | 1.394 | | 1.295 | 1.287 | 1.333 | 1.333 |
| 28.5 | 1.352 | 1.363 | 0.980 | 1.346 | 1.358 | | 1.390 | 1.391 | 1.390 | 1.391 | 1.390 | | 1.293 | 1.285 | 1.328 | 1.328 |
| 29 | 1.355 | 1.355 | 0.960 | 1.342 | 1.352 | | 1.385 | 1.385 | 1.384 | 1.386 | 1.385 | | 1.290 | 1.284 | 1.327 | 1.327 |
| 29.5 | 1.348 | 1.348 | 0.977 | 1.338 | 1.345 | | 1.374 | 1.376 | 1.375 | 1.376 | 1.377 | | 1.290 | 1.285 | 1.331 | 1.331 |
| 30 | 1.347 | 1.347 | 0.980 | 1.336 | 1.339 | | 1.360 | 1.361 | 1.362 | 1.362 | 1.362 | | 1.291 | 1.287 | 1.323 | 1.326 |
| 30.5 | 1.348 | 1.348 | 0.960 | 1.333 | 1.334 | | 1.355 | 1.356 | 1.357 | 1.357 | 1.356 | | 1.292 | 1.287 | 1.324 | 1.322 |
| 31 | 1.340 | 1.340 | 0.977 | 0.968 | 0.971 | | 1.010 | 1.003 | 0.989 | 0.994 | 0.998 | | 0.948 | 0.943 | 1.324 | 1.324 |
| 31.5 | 1.340 | 1.340 | 1.354 | 1.360 | 1.345 | | 1.381 | 1.371 | 1.368 | 1.372 | 1.370 | | 1.340 | 1.336 | 1.323 | 1.324 |
| 32 | 1.340 | 1.340 | 1.354 | 1.359 | 1.346 | | 1.381 | 1.371 | 1.368 | 1.373 | 1.371 | | 1.339 | 1.336 | 1.324 | 1.324 |

ELECTRONIC DEVICE AND METHOD OF MANUFACTURING THE SAME

FIELD OF ART

The present invention relates to an electronic device and a method of manufacturing the same. For example, the invention is concerned with a technique applicable effectively to the fabrication of a memory card which incorporates a semiconductor chip with an IC (integrated circuit) built into a thin card.

BACKGROUND ART

As storage mediums used in digital cameras and audio players there are used memory cards called, for example, SD (Secure Digital) Card, Memory Stick, and Multi Media Card. The memory cards are characterized by being as thin as 1.4 to 3 mm or so. Multi Media Card is a generic term for memory cards formed in accordance with a standard published by Multi Media Card Association (MMCA).

In Japanese Published Unexamined Patent Application No. 2000-236043 there is described a warp preventing technique for a COB (chip on board) package which is assembled to a chip card. In this publication there is described a structural example in which a COB package having a sealing member on one surface of a printed circuit board is bonded to a receptacle portion which is a recess formed in one surface of a card body. Reference is also here made to Japanese Published Unexamined Patent Application No. Hei 11(1999)-45959 which describes a technique for preventing the warp of a COB substrate.

Further, in Japanese Published Unexamined Patent Application No. Hei 8(1996)-156470 there is described a technique for preventing the occurrence of breakage in the vicinity of a tip corner of an IC mounting portion upon imposition of a flexural deformation on an IC card. In this publication it is described that when an IC module is bonded with an adhesive into a hole formed in a card substrate, if the IC module is forced into the hole, the adhesive will protrude to the exterior of the hole.

The applicant in the present case has also developed a small-sized memory card called a multi-media card. As shown in FIG. 29(a), this memory card, which is indicated at 1, comprises a card-like cap 2 and a substrate 6, the substrate 6 having a sealing member 5 which is affixed through an adhesive 4 to a stepped recess 3 formed in one surface of the cap 2. The substrate 6 serves as a wiring substrate, and within the sealing member 5 are present plural semiconductor chips (not shown) fixed to the substrate 6 and wires for electrically connecting electrodes formed on the semiconductor chips with wiring lines formed on the substrate.

The sealing member 5 is formed of an insulating resin by transfer molding to improve the productivity. The substrate 6 is formed by a glass fabric-based epoxy resin board. The semiconductor chips are formed of silicon (Si) and the sealing member 5 is formed of an epoxy resin. A surface of the memory card 1 is located on a back surface 6b side of the substrate 6 affixed to a back surface 2b of the cap 2. The surface portion of the cap 2 exposed framewise around the substrate 6 is the back surface 2b. Where required, a film or the like having predetermined printed characters or the like is affixed to the surface 2a of the cap 2 or the back surface 6b of the substrate 6.

It has turned out that there sometimes occurs the following defect in manufacturing the memory card 1. As shown in FIG. 29(b), when the substrate 6 is bonded to the cap 2 with use of the adhesive 4, the back surface 6b of the substrate 5 warps in a depressed state and end portions of the substrate 6 project from an upper surface of the cap 2.

This is caused by a heat distortion based on a difference in thermal expansion coefficient among the substrate 6, the semiconductor chips and sealing member 5 which occurs at the time of radiation of heat after transfer molding and heat curing of the molding resin. The thermal expansion coefficient of the glass fabric-based epoxy resin board which constitutes the substrate 6 is about 1.3 to $1.6 \times 10^{-5}/°$ C., that of Si which forms the semiconductor chips is about $3.0 \times 10^{-6}/°$ C., and that of the epoxy resin which forms the sealing member 5 is about 8 to $16 \times 10^{6}/°$ C. As a result, after transfer molding, the sealing member 5 projects toward a surface 6a of the substrate 6 and the back surface 6b of the substrate 6 warps in a centrally depressed state, as shown in FIG. 29(b).

Due to such a depressed warp phenomenon of the back surface 6b of the substrate 6, even if both ends of the substrate 6 are affixed uniformly to the cap 2, they project (projection quantity "a") from the back surface 2b (upper surface in FIG. 29) of the cap 2. When the memory card 1 is to be used, it is inserted into a slot of a digital camera or the like, but if the projection quantity "a" is large, the projecting portion will be caught in the slot and hence it will become impossible to insert the memory card 1 into the slot. The projection quantity "a" differs depending on the size of the substrate 6, but if the substrate size is, for example, 32 mm long, 23 mm wide, and 1.4 mm thick, the projection quantity "a" is as large as about 150 to 200 µm.

If the substrate 6 is affixed to the cap 2 in an offset manner, an end portion of the substrate warps to a larger extent, as shown in FIG. 29(c). For example, where the thickness of the cap 2 is 1.4 mm, a total thickness "c" is as large as 1.7 mm.

Further, when the substrate 6 is affixed to the cap 2 through the adhesive 4, the adhesive 4 protrudes like arrows from between substrate ends and peripheral edges of the recess 3 of the cap 2, thereby forming raised portions 7. Such a rising phenomenon of the adhesive results in a structure in which an outer surface of the substrate 6 warps in a depressed state. In view of this structure it has turned out that when the substrate 6 is pushed against the cap 2, the warp acts to push out the adhesive 4 present centrally of the recess 3 toward the peripheral edges of the substrate 6 and that therefore the adhesive rising phenomenon becomes easier to occur.

FIG. 30 is a three-dimensional representation of results obtained by measuring a state of warp of a substrate used in a memory card commercially available from A company. In the same figure, longitudinal graduations 0 to 32 are in mm and transverse graduations 0 to 20 are also in mm. Graduations 0 to 1.6 represent the thickness (height) from the surface of the cap and the unit thereof is mm. Also in this example, a central part of a substrate is depressed. Further, it is seen that peripheral edge portions of the substrate project beyond the cap thickness of 1.4 mm.

FIG. 31 represents results of having measured a state of warp of a substrate used in a memory card available commercially from B company, in three-dimensions after image processing. Like the structure shown in FIG. 30, a central part of the substrate is depressed. It is seen that peripheral edge portions of the substrate project beyond the cap thickness of 1.4 mm.

FIG. 32 represents results of having measured a state of warp of a substrate used in a memory card available commercially from C company, in three-dimensions after image processing. In the same figure there is shown an arcuate surface which warps longitudinally of the memory card and projects centrally. Also in this warped state peripheral edges of the substrate project beyond the cap thickness of 1.4 mm. Also in this example it is seen that side edges located near the central part of the substrate further project from the cap.

It is an object of the present invention to provide an electronic device of a structure in which a substrate is affixed through an adhesive to a recess formed in a back surface of a cap, with substrate edges being not projected from the back surface of the cap, as well as a method of manufacturing the electronic device.

It is another object of the present invention to provide a memory card of a structure in which a substrate is affixed through an adhesive to a recess formed in a back surface of a cap, with substrate edges being not projected from the back surface of the cap, as well as a method of manufacturing the memory card.

It is a further object of the present invention to provide an electronic device of a structure in which a substrate is affixed through an adhesive to a recess formed in a back surface of a cap and in which a raised portion caused by flowing out of the adhesive does not occur on the back surface of the cap, as well as a method of manufacturing the electronic device.

It is a still further object of the present invention to provide a memory card of a structure in which a substrate is affixed to a back surface of a cap through an adhesive and in which a raised portion caused by flowing out of the adhesive does not occur on the back surface of the cap, as well as a method of manufacturing the memory card.

The above and other objects and novel features of the present invention will become apparent from the following description and the accompanying drawings.

DISCLOSURE OF THE INVENTION

Typical modes of the present invention as disclosed herein will be outlined below.

(1) An electronic device comprising a substrate which is a wiring substrate, one or more semiconductor chips fixed to a surface of the substrate and having predetermined electrodes connected electrically to wiring lines formed on the substrate, a sealing member formed of an insulating resin on the surface of the substrate to cover a predetermined area including the semiconductor chip(s), and a cap having a recess formed in a back surface thereof which recess permits the substrate and the sealing member to be received therein, the sealing member on the substrate being received in the recess of the cap and the substrate being affixed to the cap through the adhesive, wherein peripheral edges of the substrate do not project from the recess to the back surface of the cap, and a central portion of the substrate warps so as to project in a direction away from the cap.

Such an electronic device (memory card) is fabricated, for example, by a method comprising the steps of fixing semiconductor chips (a memory chip and a control chip) to a surface of a substrate which is a wiring substrate; connecting electrodes formed on the semiconductor chips and wiring lines formed on the substrate with each other electrically using a connecting means; molding a predetermined area including the semiconductor chips with an insulating resin to form a sealing member which covers the semiconductor chips and the connecting means; placing and pushing the sealing member and the substrate portion into and against a recess of a cap, the recess being formed in a back surface of the cap so as to permit the substrate and the sealing member to be received therein, and bonding the substrate to the cap through an adhesive put into the recess; and allowing the adhesive to cure, wherein a thermal expansion coefficient of a material which forms the substrate and that of a material which forms the sealing member are selected so that the substrate after molding warps in a centrally projected state toward a back surface of the substrate, and thereafter the substrate is fixed to the cap through the adhesive, peripheral edges of the substrate being not projected from the recess to the back surface of the cap, and the substrate being centrally warped so as to project in a direction away from the cap.

According to the above means (1):

(a) peripheral edges of the substrate do not project from the recess to the back surface side of the cap. Therefore, in the case of a memory card, there does not occur such an inconvenience as the memory card cannot be inserted into a slot of a digital camera or the like.

(b) The surface side of the substrate with the sealing member formed thereon is depressed, so that when the substrate is pushed against the cap so as to be affixed to the cap through an adhesive, the peripheral edges of the substrate surround the adhesive and act to move the adhesive inwards, so that it is possible to prevent the adhesive from leaking out to the back side of the cap from the peripheral edges of the substrate. Therefore, it is possible to prevent the occurrence of a memory card not being inertable into a slot of a digital camera or the like due to leakage of the adhesive.

(c) With the above effects (a) and (b), it is possible to improve the dimensional accuracy of the memory card and prevent the formation of a projection and leakage of the adhesive, whereby the quality becomes stable. As a result, the manufacturing yield is improved, and reductions in product cost can be attained.

BRIEF DESCRIPTION OF THE DRAWINGS

FIG. 6 is a numeric table showing a portion of data which underlie the three-dimensional diagram of FIG. 5;

BEST MODE FOR CARRYING OUT THE INVENTION

Figure 1:
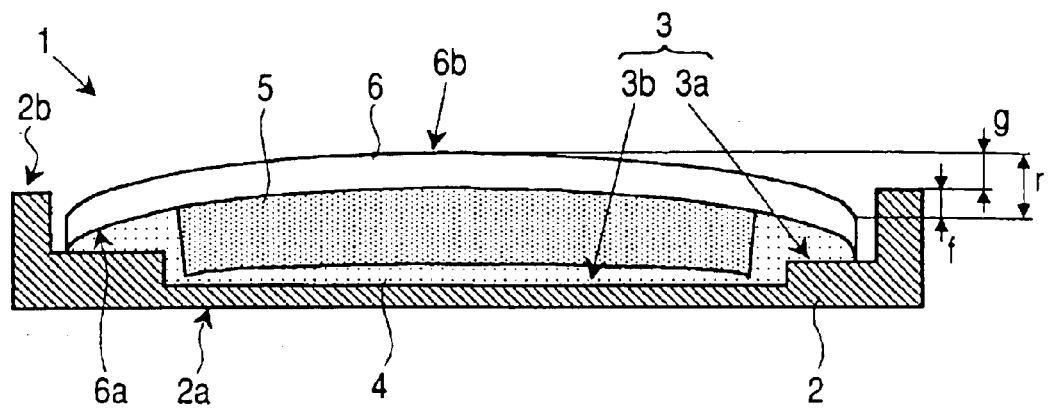
FIG. 1 is an exaggerated schematic sectional view of a memory card according to an embodiment (first embodiment) of the present invention.

Embodiments of the present invention will be described in detail hereinunder with reference to the accompanying drawings. In all of the drawings for illustrating the embodiments, constituent portions having the same functions are identified by like reference numerals, and repeated explanations thereof will be omitted.

(First Embodiment)

In this first embodiment the present invention is applied to, for example, a memory card (e.g., a multi-media card having a capacity as large as 64 MB) as an electronic device having a memory chip and a control chip for controlling the memory chip.

Figure 8:
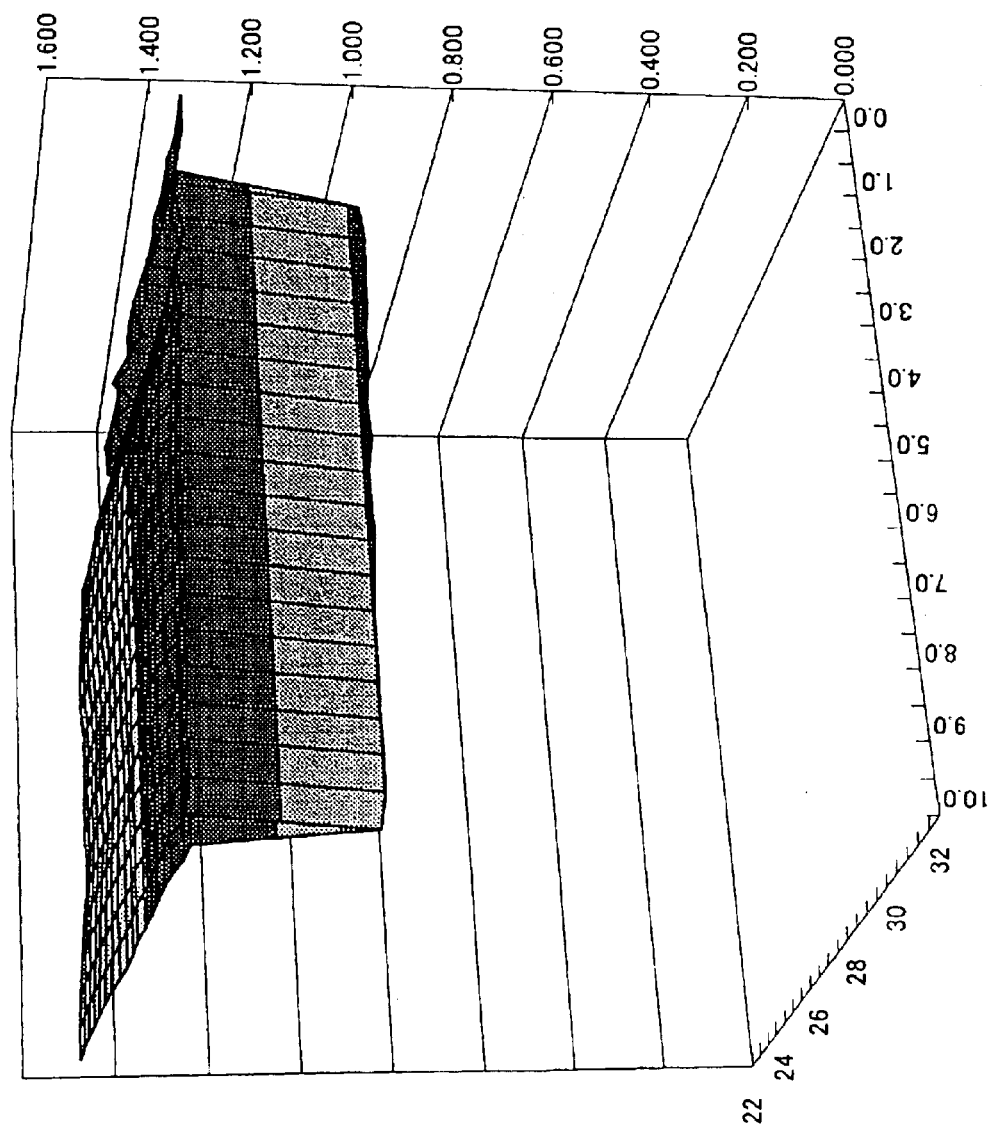
FIG. 8 is a partial three-dimensional diagram showing a state of warp of the substrate back surface, including a rear side of the three-dimensional diagram of FIG. 5.
Figure 9:
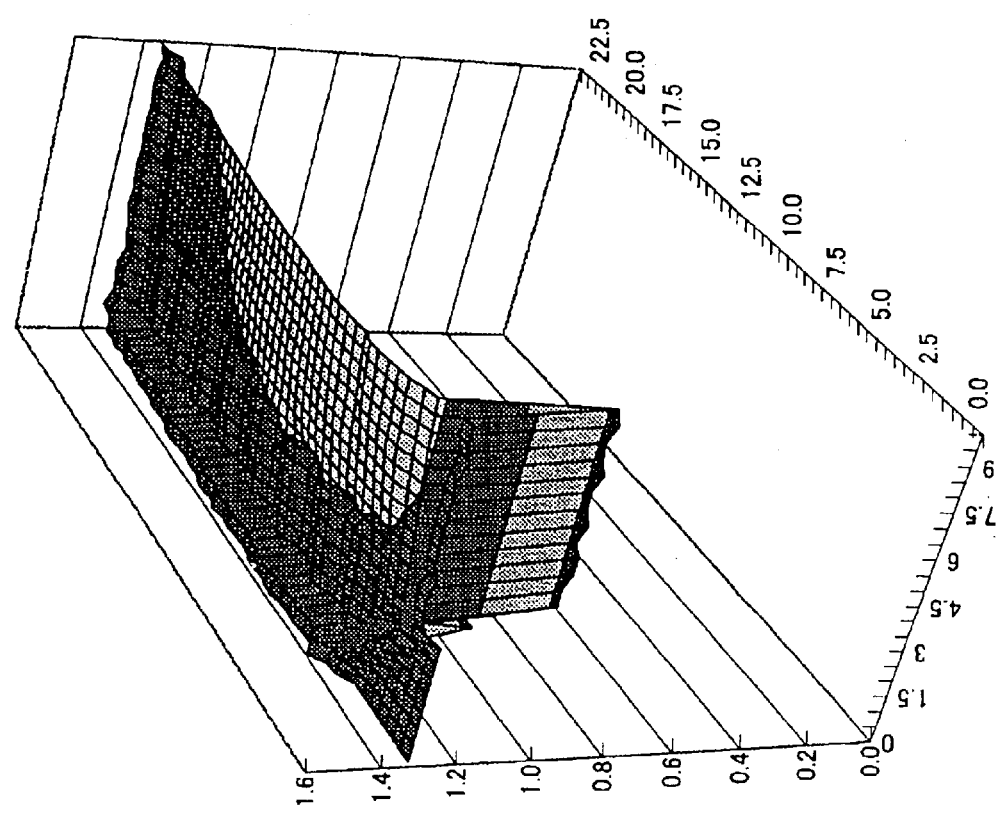
FIG. 9 is a partial three-dimensional diagram showing a state of warp of the substrate back surface, including terminal portions of the three-dimensional diagram of FIG. 5.
Figure 10:
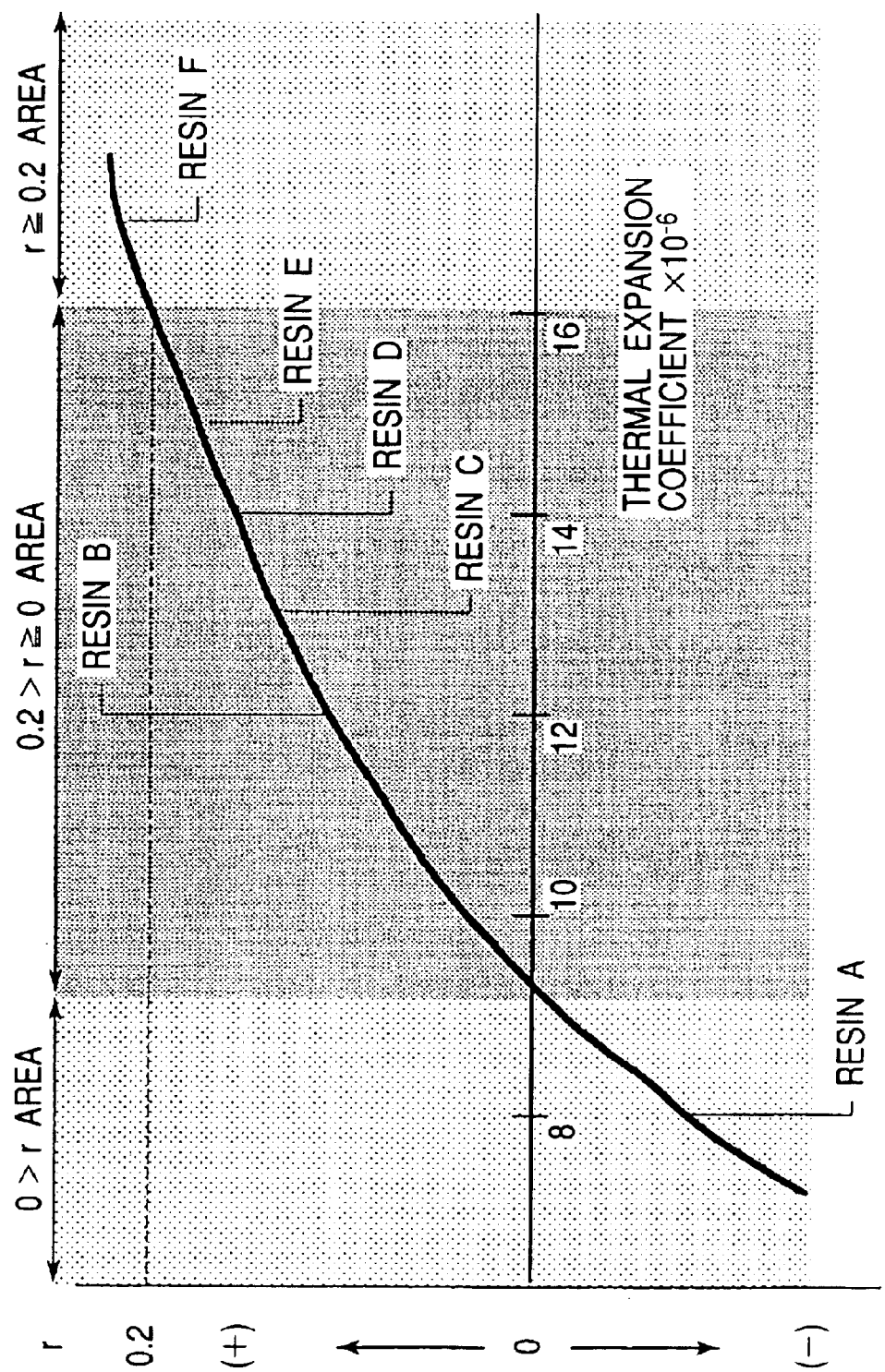
FIG. 10 is a graph showing a difference in distance "r" from a virtual reference plane due to a difference of resin used in a sealing member in the memory card of the first embodiment.
Figure 11:
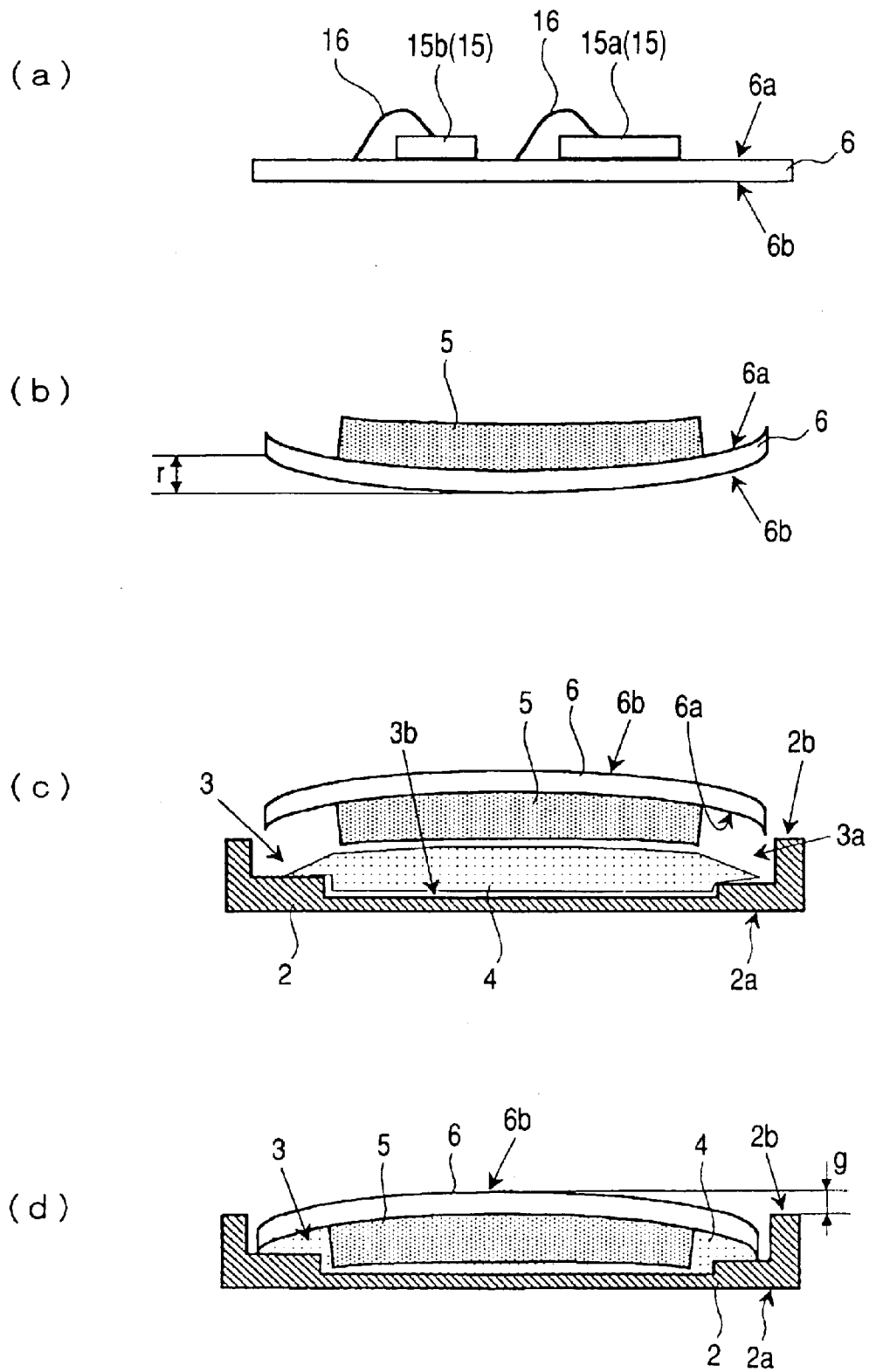
FIG. 11 is a schematic diagram showing states of manufacturing steps in manufacturing the memory card of the first embodiment.

FIGS. 1 to 20 are concerned with the manufacture of a memory card according to an embodiment (first embodiment) of the present invention, of which FIGS. 1 to 4 are concerned with the structure of the memory card, FIGS. 5 to 9 illustrate a three-dimensional representation showing a state of warp of a substrate on a back surface side of the memory card, as well as data which underlie the three-dimensional representation, FIG. 10 is a graph showing a difference in distance "r" from a virtual reference plane due to a difference of resin used in a sealing member, and FIGS. 11 to 20 are related to the manufacture of the memory card.

Figure 2:
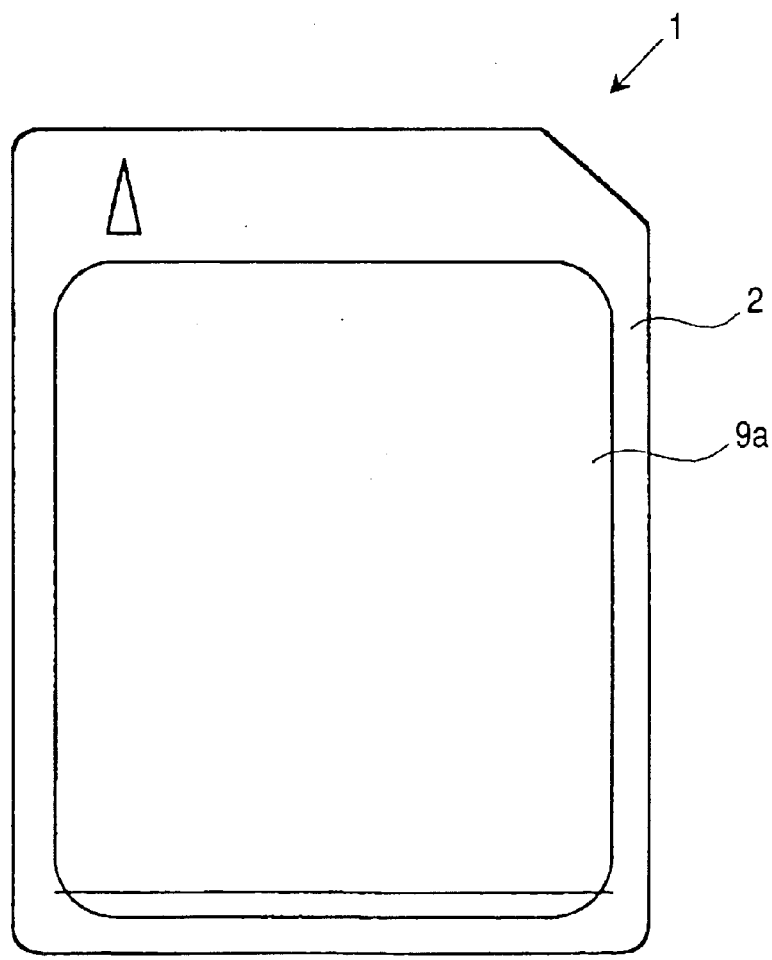
FIG. 2 is a plan view showing a surface of the memory card.
Figure 3:
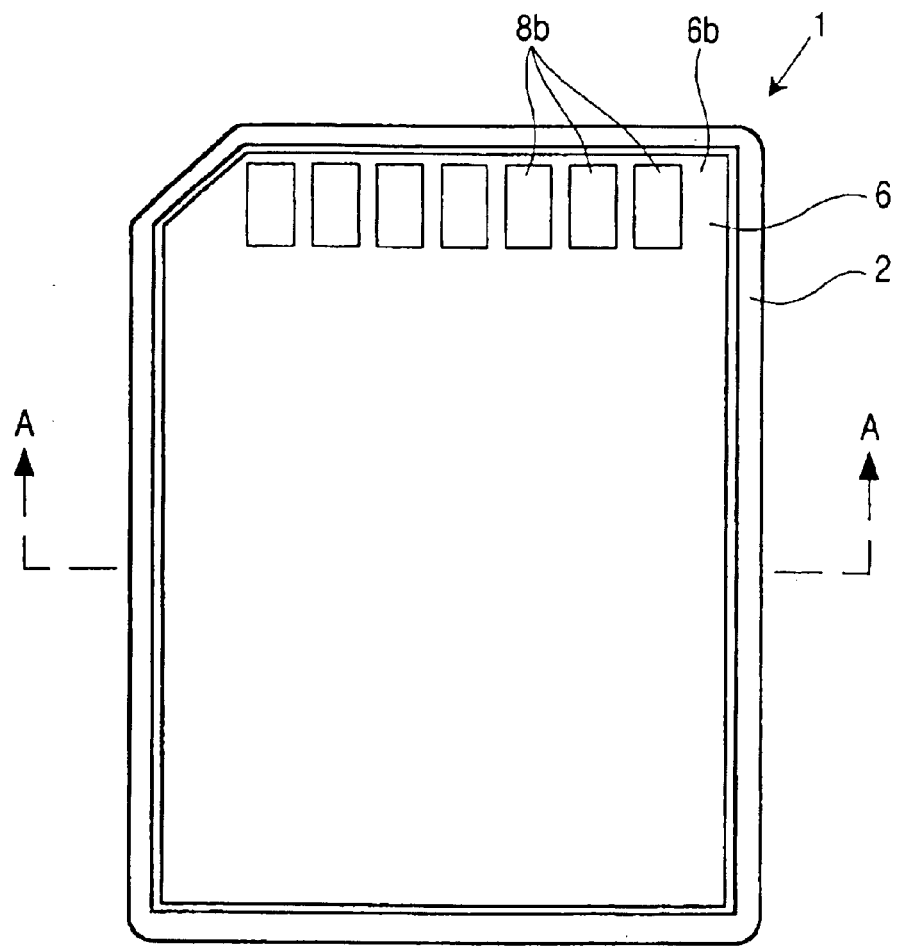
FIG. 3 is a bottom view showing a back surface of the memory card.
Figure 4:
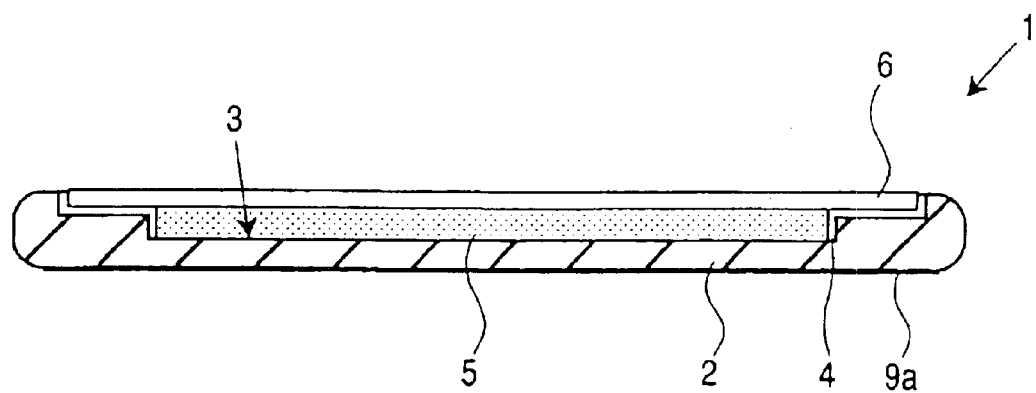
FIG. 4 is a sectional view taken along line A—A in FIG. 3.

In appearance, the memory card, indicated at 1, is in the form of a thin plate (card), as shown in FIGS. 2 to 4. FIG. 2 is a plan view showing a surface of the memory card, FIG. 3 is a bottom view showing a back surface of the memory card, and FIG. 4 is a side view taken along line A—A in FIG. 3. Further, FIG. 1 is an exaggerated schematic sectional view of the memory card.

As shown in FIGS. 1 to 4, the memory card 1 of this first embodiment is made up of a card-like cap 2 and a substrate 6 having a sealing member 5, the substrate 6 being affixed through an adhesive 4 to a stepped recess 3 formed in one surface of the cap 2. An exposed flat surface of the cap 2 is a surface 2a which is a surface side of the memory card 1 and to which is affixed a seal 9a describing functions and product contents. An exposed back surface 6b of the substrate 6 is a back surface side of the memory card 1.

Figure 14:
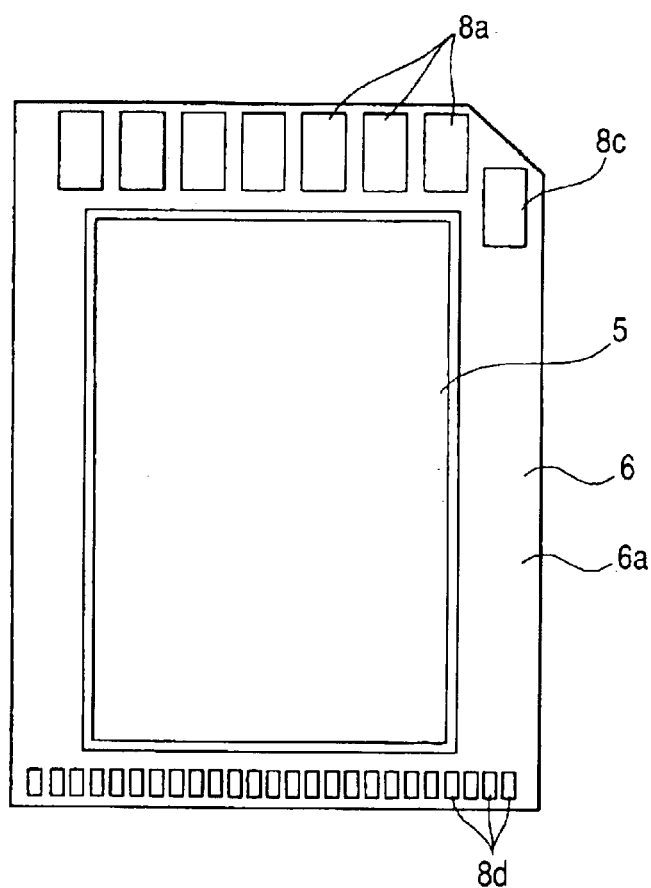
FIG. 14 is a plan view showing a surface of the substrate with a sealing member formed thereon in manufacturing the memory card of the first embodiment.
Figure 15:
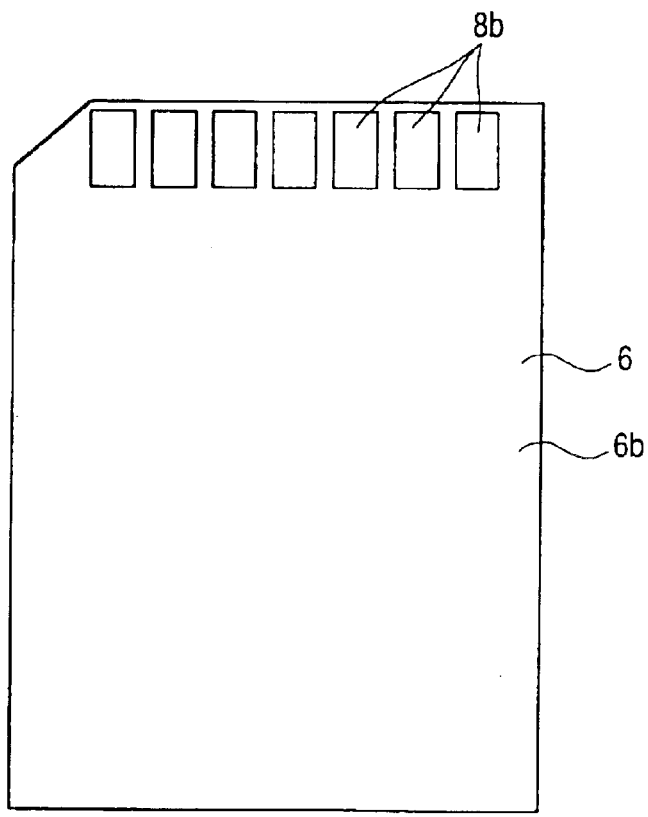
FIG. 15 is a bottom view showing a back surface of the substrate formed with the sealing member in manufacturing the memory card of the first embodiment.
Figure 16:
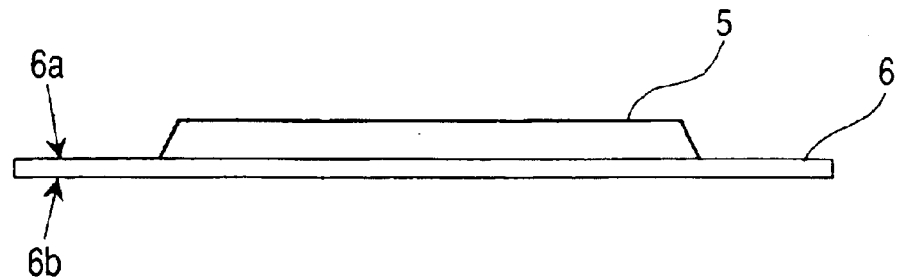
FIG. 16 is a side view of the substrate formed with the sealing member in manufacturing the memory card of the first embodiment.

The substrate 6 has a wiring substrate structure. One or plural semiconductor chips (not shown) are mounted on a surface 6a of the substrate 6, and electrodes formed on the semiconductor chip(s) and wiring lines formed on the substrate 6 are connected together through conductive wires. The semiconductor chip(s) and the wires are covered with the sealing member 5 which is formed of an insulating resin by transfer molding. For example, the substrate 6 is a glass fabric-based epoxy resin wiring board having a thickness of 0.33 mm, a width of 21 mm and a length of 30 mm (in the present invention, as the glass fabric-based epoxy resin wiring board there may be used one having a thermal expansion coefficient of $1.3 \times 10^{-5}/°C$ to $1.6 \times 10^{-5}/°C$.). The substrate 6, which is rectangular (quadrangular), is obliquely cut off at one corner thereof to afford a slant face, as shown in FIGS. 14 and 15. As shown in FIG. 3, external electrode terminals 8b formed on the back surface 6b of the substrate 6 are exposed to the back surface of the memory card 1.

When the memory card 1 is inserted into a slot of a digital camera, the external electrode terminals 8b come into contact with electrode terminals formed within the slot. As shown in FIG. 14, electrode terminals 8a for inspection corresponding to the external electrode terminals 8b, as well as electrode terminals 8c and 8d for inspection, are provided on the surface 6a of the substrate 6.

Figure 17:
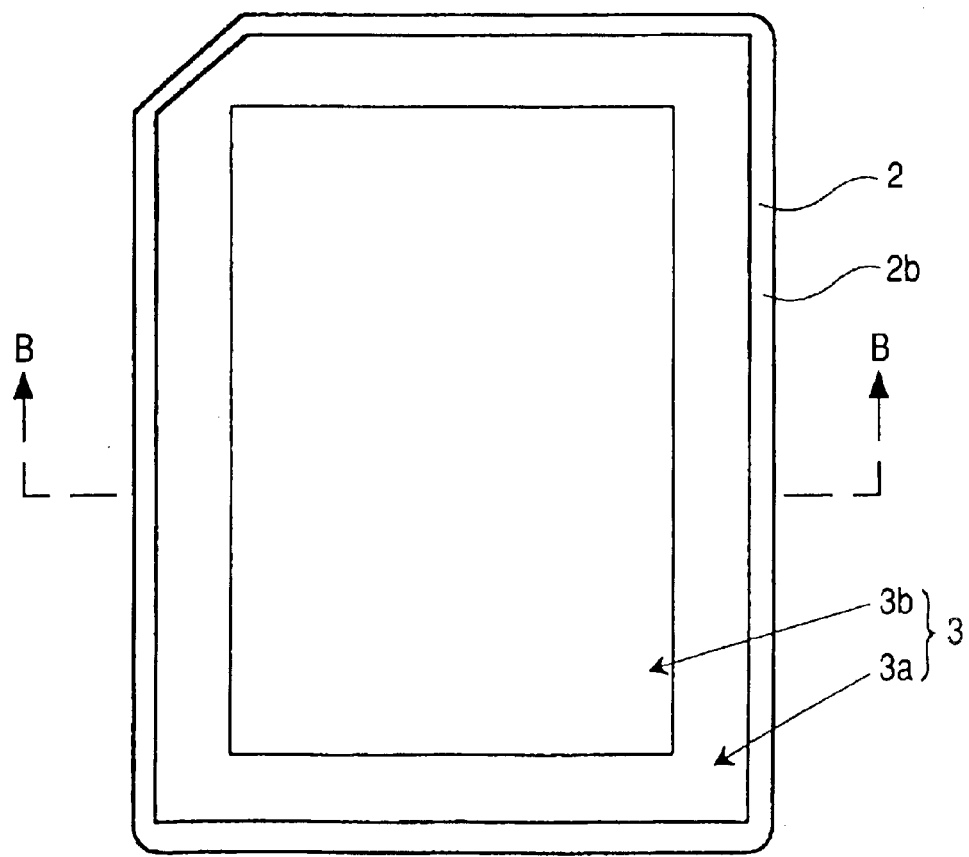
FIG. 17 is a plan view showing a back surface of a cap used in manufacturing the memory card of the first embodiment.
Figure 18:
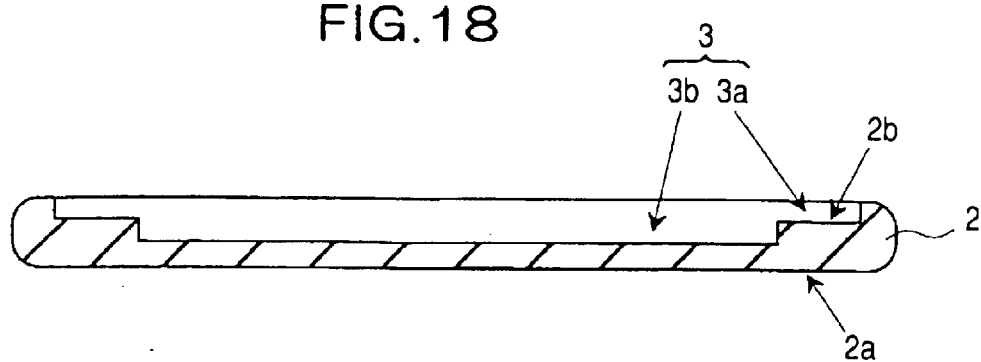
FIG. 18 is a sectional view taken along line B—B in FIG. 17.

As shown also in FIGS. 17 and 18, the cap 2 is constituted by a resin case (e.g., PPE: polyphenyl ether) and is, for example, 32 mm long, 23 mm wide, and 1.4 mm thick. In a back surface 2b of the cap 2 is formed a stepped recess 3. The stepped recess 3 comprises a shallow recess 3a for fitting therein of the substrate portion and a deep recess 3b for fitting therein of the sealing member 5, the deep recess 3b being formed in a bottom of the shallow recess 3a. The substrate 6 is in a rectangular shape (30 mm long by 21 mm wide) with one corner thereof cut off obliquely and therefore the size of the shallow recess 3a is a little larger than that of the rectangular shape. A clearance between peripheral edges of the substrate 6 and the shallow recess 3a in a fitted state of the substrate into the recess is 0.15 mm or so.

The deep recess 3b is for fitting therein of the sealing member 5 which is formed on the surface 6a of the substrate 6. Given that the height of the sealing member 5 is about 0.64 mm, the depth of the deep recess 3b is, for example, 0.71 mm to create a clearance of 70 μm. An adhesive does not flow smoothly unless there is a space of about 40 μm in height though this differs depending on the type of the adhesive used. For this reason the clearance is set at 70 μm in this first embodiment. A predetermined clearance is formed also between an inner periphery surface of the deep recess 3b and an outer periphery surface of the sealing member 5 so that the adhesive 4 can flow from the deep recess 3b to the shallow recess 3a.

As shown in FIG. 1, one of the features of the memory card of this first embodiment resides in a structure such that edges of the substrate 6 are retracted into the shallow recess 3a and do not project to the exterior. Therefore, the height from an upper surface of the sealing member 5 formed on a main surface of the substrate 6, i.e., from a surface of the sealing member 5 close to the bottom of the deep recess 3b in the cap 2, to the back surface of the substrate 6 at peripheral edges of the substrate, should be within the stepped recess of the cap 2. In other words, the height from the upper surface of the sealing member 5 to the back surface of the substrate 6 at peripheral edges of the substrate should be lower than the height from the bottom of the deep recess 3b in the cap 2 to the back surface 2b of the cap. By satisfying this morphological requirement it is possible to realize a shape wherein peripheral edges of the substrate 6 are received within the shallow recess 3a. The depth of the shallow recess 3a is larger than the sum of the thickness of the substrate 6 and the thickness of the adhesive 4 which is for affixing the substrate to the recess bottom. For example, if the thickness of the substrate 6 is 0.38 mm, the depth of the shallow recess 3a is set at 0.28 mm taking the thickness of the adhesive 4 also into account, to give a difference of 0.05 mm from the case where the adhesive 4 is not present. In this way, as shown in FIG. 1, the memory card 1 is fabricated so that a difference "f" in height between the back surface 2b of the cap 2 and an upper edge of an end of the substrate 6 is, for example, 0 to 0.05 mm.

It is important that a projecting height "g" of the substrate from the back surface 2b of the cap 2 be within a specified range, e.g., 0.15 mm or less.

In this first embodiment, in order for edges of the substrate 6 to be retracted inside the recess 3a and not to project to the exterior, there is adopted such a warped structure as shown in FIG. 1 in which the substrate 6 is warped so that its back surface 6b projects centrally and in which peripheral edges of the substrate surface 6a is put in contact with the bottom of the shallow recess 3a. For this warped structure it is effective to select an appropriate thermal expansion coefficient of the material which forms the substrate 6 and that of the material which forms the sealing member 5.

FIG. 10 is a graph obtained from experiments conducted by the present inventor. In the structure of this first embodiment, the warp of the substrate 6 was checked using as the substrate 6 a glass fabric-based epoxy resin board having a thermal expansion coefficient of $1.5\times10^{-5}/°$ C. and while changing the type of resin which constitutes the sealing member 5. Among resins available commercially, resins A to F were selected as resins capable of achieving this purpose. The selected resins are different in thermal expansion coefficient a due to a difference in their components.

As shown in FIG. 1, if a projecting height of the substrate 6 from a peripheral edge of its back surface 6b, in other words, the distance from a virtual reference plane to a peripheral edge on the back surface 6b side of the substrate, the virtual reference plane corresponding to a central surface portion of the substrate back surface 6b, is assumed to be "r," then in the case of resin A having a thermal expansion coefficient of $8\times10^{-6}/°$ C. the substrate 6 warps in a minus (−) direction, that is, the back surface 6b is depressed, whereas in the case of resin B having a thermal expansion coefficient of $12\times10^{-6}/°$ C. the substrate 6 warps in a plus (+) direction, i.e., the surface 6a is depressed, mainly under the influence of the thermal expansion coefficient and cure shrinkage of the resin. In the case of resins C to F which are still larger in thermal expansion coefficient than resin B, the larger the thermal expansion coefficient, the larger the warp in the plus direction, i.e., the larger the depression of the surface 6a of the substrate 6, and the larger the distance "r."

In this first embodiment a maximum value of the distance "r" is set at 0.2 mm for example so that the projecting height "g" of the back surface 6b of the substrate 6 after assembly is within the specified range. The value of 0.2 mm is a value determined while taking variations in thickness of the adhesive 4 into account. If a constant thickness of the adhesive 4 is ensured, the maximum value of the distance "r" will not always be limited to 0.2 mm.

As an example, therefore, it is assumed that a resin which permits the distance "r" to be in the range of 0.2 mm>r≧0 is employable and that in the present invention there are used such resins B to E as shown in FIG. 10. However, even if the type of resin fed increases, such increased types of resins are also employable if they are in the range from about $9\times10^{-6}/°$ C. to about $16\times10^{-6}/°$ C. in thermal expansion coefficient.

It goes without saying that the setting of the distance "r" is changed if the specified value changes and that if there is a request for a product not falling under the specified range, there is selected a distance "r" which meets the request.

Figure 5:
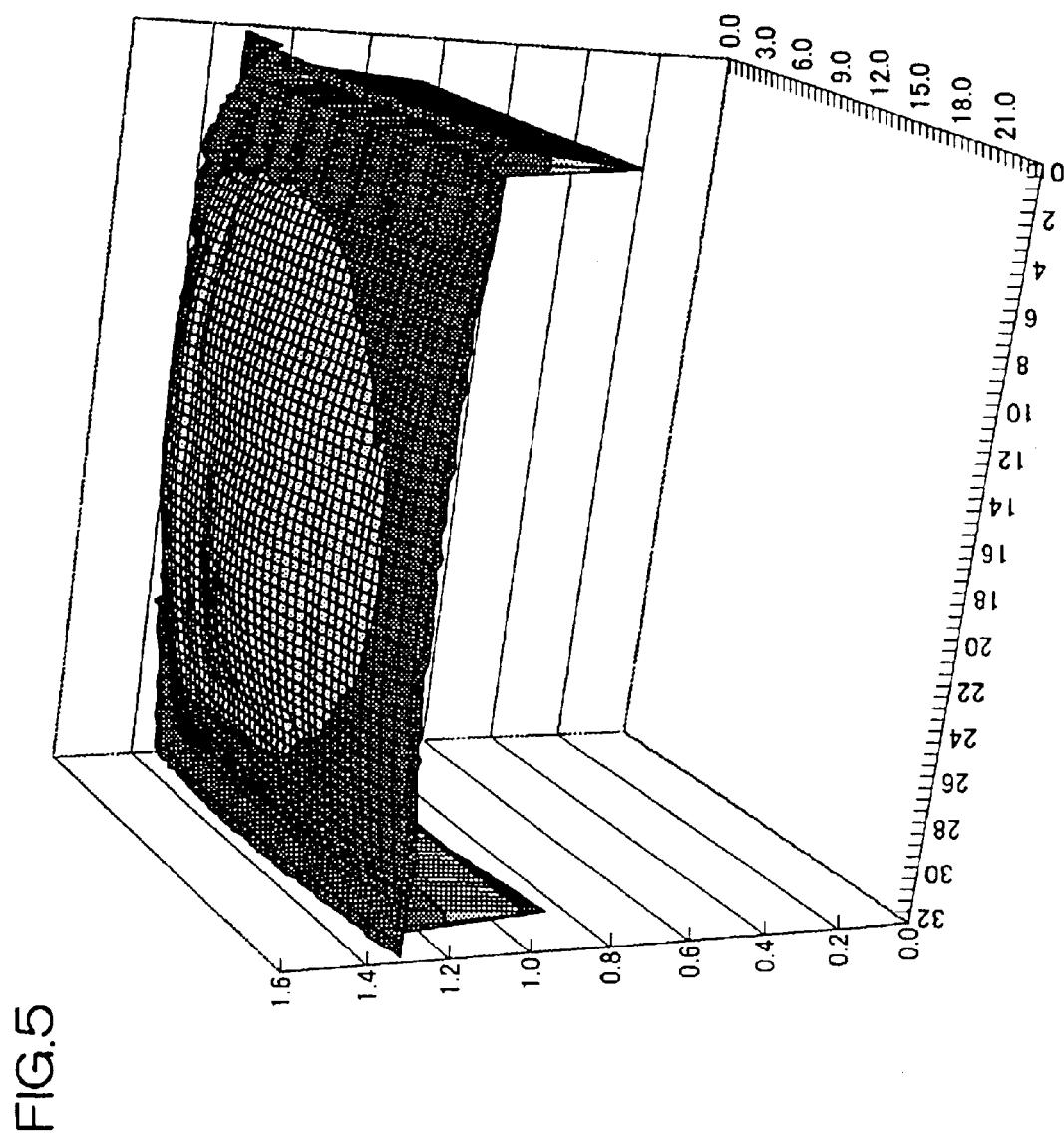
FIG. 5 is a three-dimensional diagram based on measurement results, showing a frame-like cap portion at the back surface of the memory card and a state of warp of a back surface of a substrate.

Resin B is used in this first embodiment. FIG. 5 is a three-dimensional diagram obtained by measuring flatness on the back surface side of the memory card 1 which has been fabricated using resin B. In the same figure there are shown flatness of the frame-like back surface 2b of the cap 2 and that of the back surface 6b of the substrate 6 which is located inside the back surface 2b and which has undergone a plus warp. From a front left to a rear left in FIG. 5 there is shown the back surface 2b of the cap nearly corresponding to the height of 1.4 mm, and an edge of the substrate back surface 6b located inside the cap back surface 2b is lower than 1.4 mm, while a central portion of the substrate back surface 6b is as high as about 1.48 to 1.49 mm. FIG. 6 is a numeric table showing a portion of data which underlie the three-dimensional diagram of FIG. 5. As shown in FIG. 6, the height of the back surface 6b at a peripheral edge of the substrate 6 takes a value smaller than 1.4 mm, and the closer to the inside, the larger the numerical value, with values of 1.48 to 1.49 mm being found in the central portion. The basic data represent a portion of such numerical values and underlie the three-dimensional diagram of FIG. 5.

Figure 7:
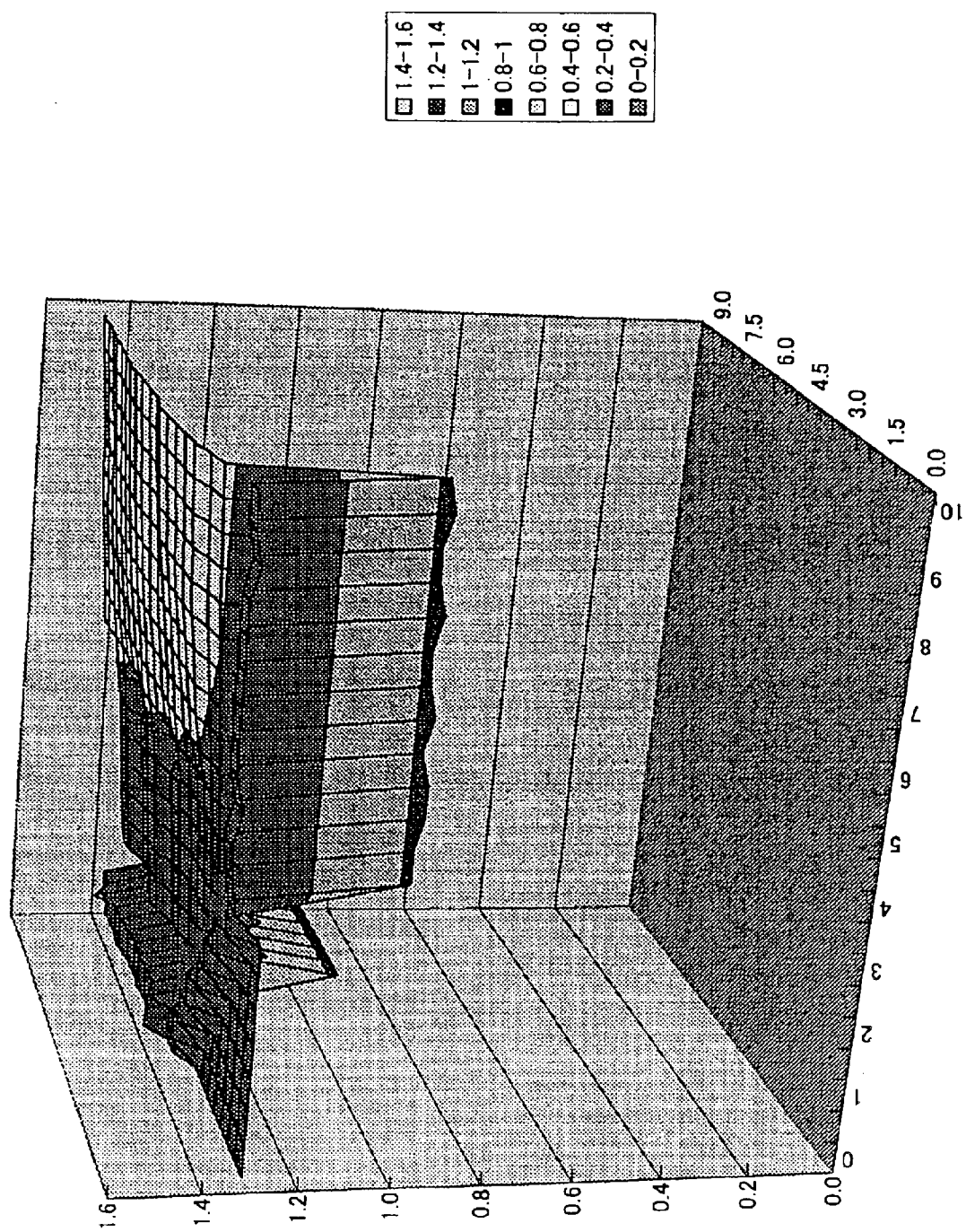
FIG. 7 is a partial three-dimensional diagram showing a state of warp of the substrate back surface, including a front side of the three-dimensional diagram of FIG. 5.

FIGS. 7 to 9 each illustrate a part of the three-dimensional diagram, of which FIG. 7 illustrates a state of warp of the substrate, including a front side in FIG. 5, FIG. 8 illustrates a state of warp of the back surface of the substrate, including a rear side of the three-dimensional diagram of FIG. 5, and FIG. 9 illustrates a state of warp of the substrate back surface, including terminal portions.

Features of the warp of the substrate back surface 6b in the memory card 1 of this first embodiment can be expressed in terms of several expressive forms as follows:

① The central portion of the substrate projects higher than side portions of the substrate.

② The central portion of the substrate projects higher than corner portions of the substrate.

③ If the substrate is divided into three equal portions lengthwise and crosswise and if a central portion and portions spreading around the central portion are assumed to be a central area and peripheral areas, respectively, a highest projecting portion of the central area is higher than highest projecting portions respectively of the peripheral areas.

④ If the substrate is divided into three equal portions lengthwise and crosswise and if a central portion and portions spreading around the central portion are assumed to be a central area and peripheral areas, respectively, a lowest projecting portion in the central area projects higher than a highest peripheral edge portion of the substrate.

⑤ If the substrate is divided into three equal portions lengthwise and crosswise and if a central portion and portions spreading around the central portion are assumed to be a central area and peripheral areas, respectively, a mean value of projecting heights in the central area is larger than a mean value of projecting heights in the peripheral areas.

Next, with reference to FIGS. 11(a) to 11(d), the following description is provided about how to fabricate the memory card 1 constructed as above. FIG. 11 is a schematic diagram showing states of the memory card manufacturing steps.

As shown in FIG. 11(a), there is provided a substrate 6 constituted by a glass fabric-based epoxy resin board having a thermal expansion coefficient of $1.5 \times 10^{-5}/°$ C. which has already been described. Then, semiconductor chips 15 are fixed to a surface 6a of the substrate 6. As the semiconductor chips 15, there are used a memory chip 15a and a control chip 15b for controlling the memory chip 15a. Thereafter, electrodes (not shown) on each semiconductor chip and wiring lines (not shown) formed on the surface 6a of the substrate 6 are connected together electrically through conductive wires 16. There may be used another means for connecting the electrodes with the wiring lines.

Next, as shown in FIG. 11(b), a sealing member 5 is formed on the surface 6a side of the substrate 6 by means of a conventional transfer molding machine. For the sealing member 5 there is used resin B having a thermal expansion coefficient of $12 \times 10^{-6}/°$ C. (Si) in order to let the substrate 6 warp so that its surface 6a is depressed, as noted earlier and as shown in FIG. 11(b). The resin B is an epoxy resin. After the transfer molding, due to a difference in thermal expansion coefficient between the sealing member 5 and the substrate 6, the substrate 6 assumes a warped shape (a plus warp structure) so as to centrally project in the direction of its back surface 6b, including in the strict sense the presence of the semiconductor chips 15 formed of silicon and fixed to the surface 6a of the substrate 6.

As a result, the distance "r" based on the warp becomes 0.1 mm or so. Since the sealing member 5 is formed by transfer molding, not only the dimensional accuracy of the sealing member is high, but also the productivity is high and it is possible to reduce the cost for forming the sealing member.

Next, as shown in FIG. 11(c), the cap 2 is provided and is placed so that its back surface 2b is positioned up. Thereafter, the adhesive 4 is fed into the recess 3 under a highly accurate quantitative control using a dispenser. This quantitative control for the adhesive 4 is important for preventing leakage of the adhesive 4.

Figure 29:
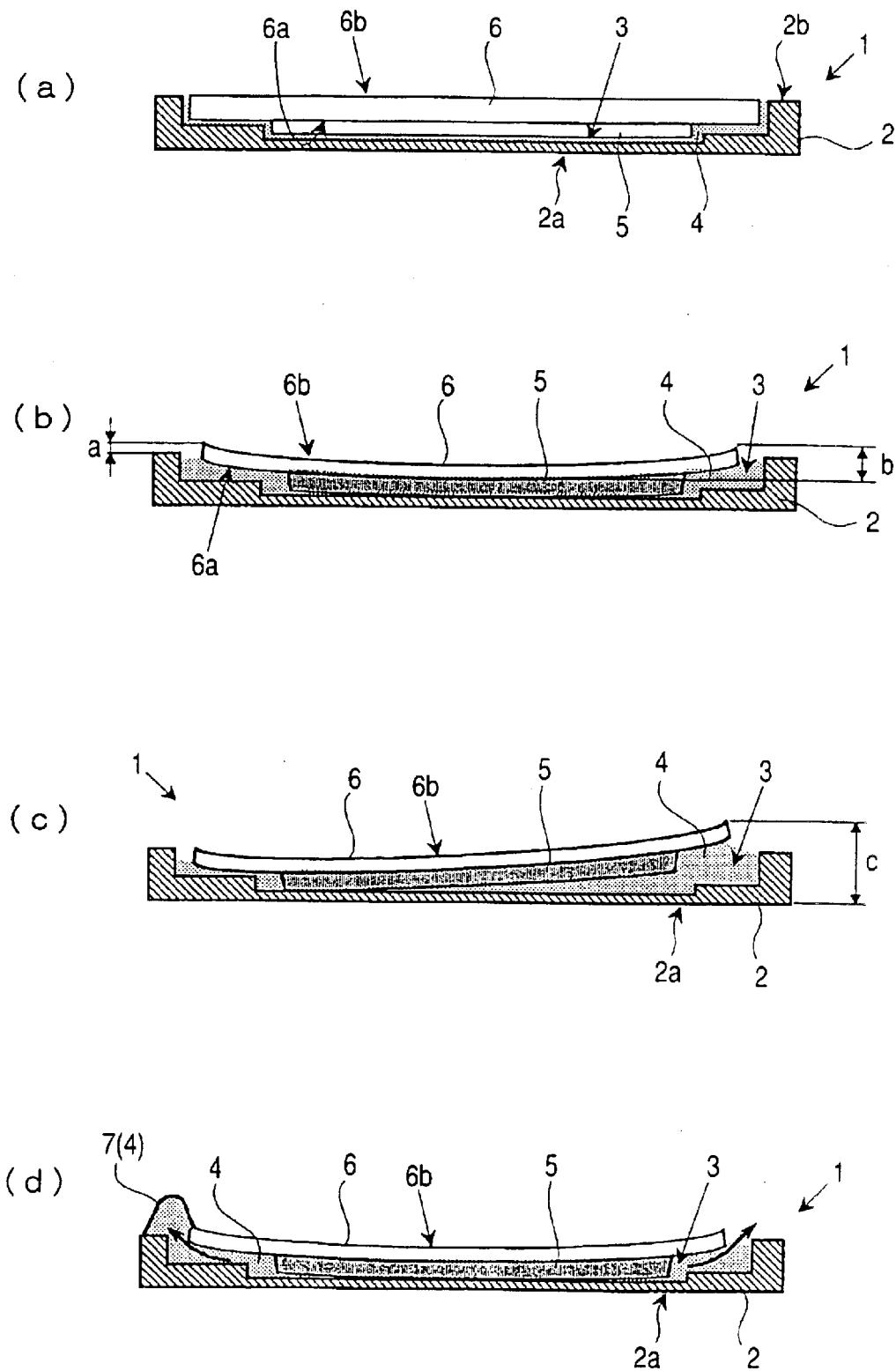
FIG 29(a)–(d) is a schematic sectional view showing a memory card which the applicant in the present case has studied prior to the present invention and also showing defective states in assembly.
Figure 30:
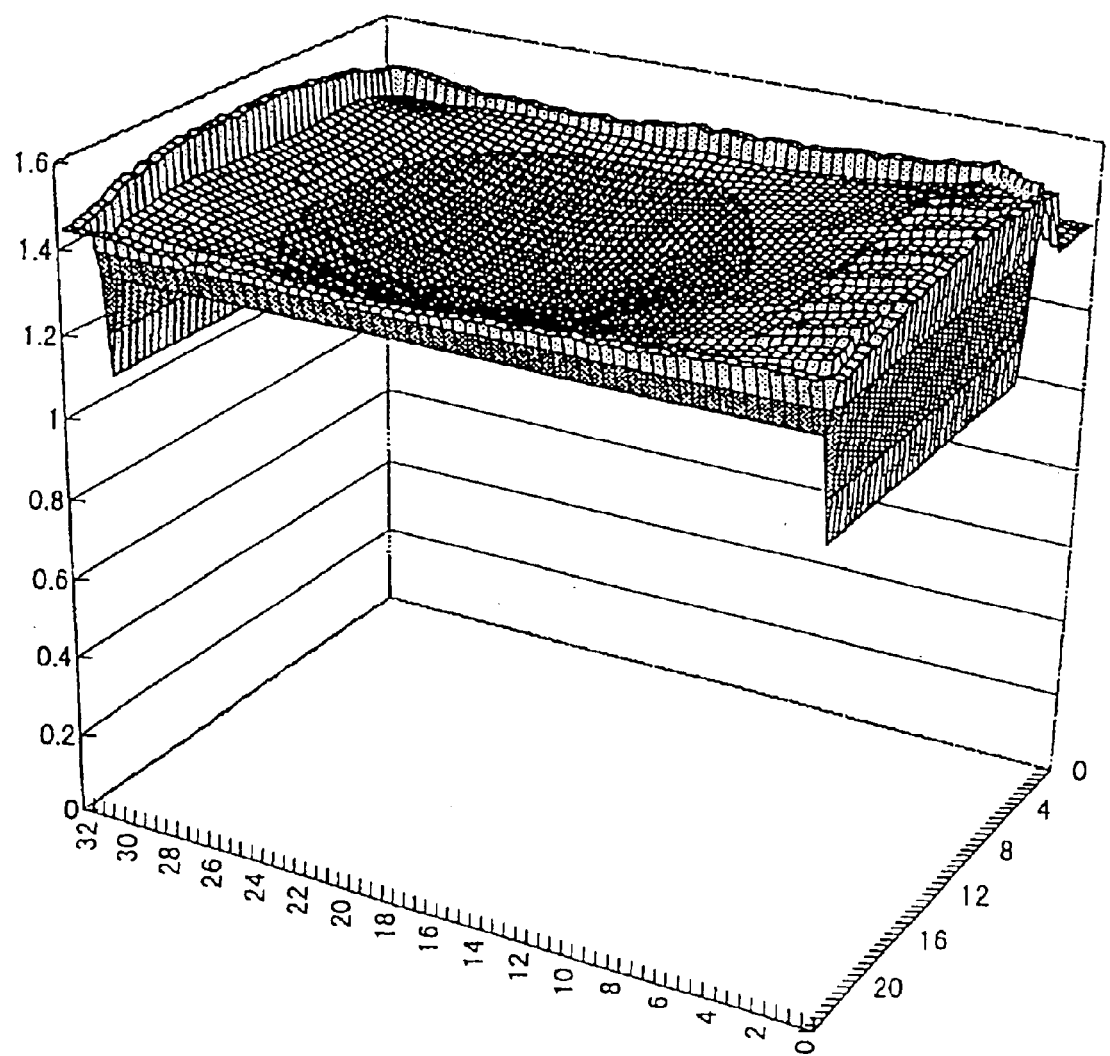
FIG. 30 is a three-dimensional diagram based on results of having measured a state of warp of a substrate used in a memory card available commercially from A company.
Figure 31:
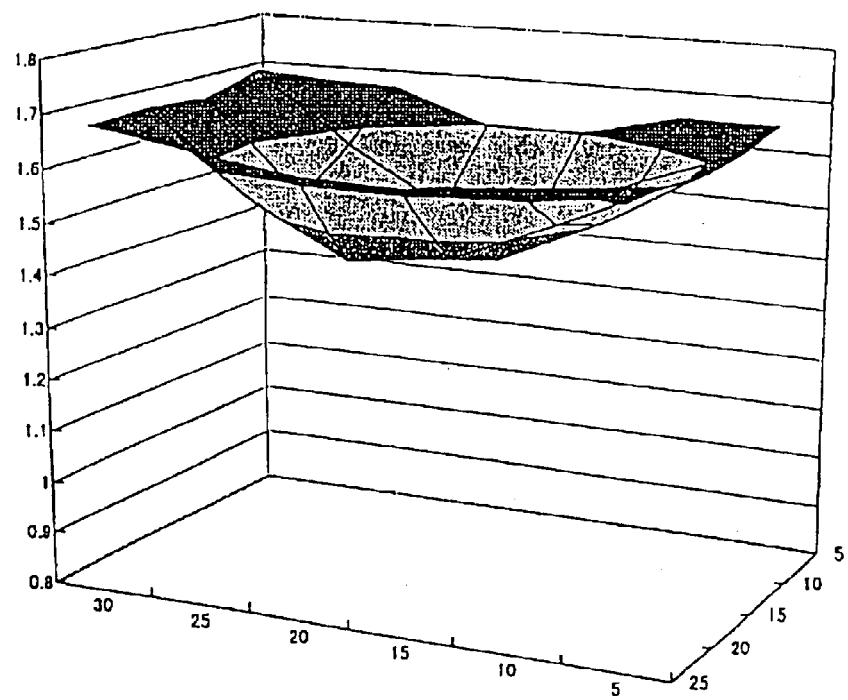
FIG. 31 is a three-dimensional diagram based on results of having measured a state of warp of a substrate used in a memory card available commercially from B company.
Figure 32:
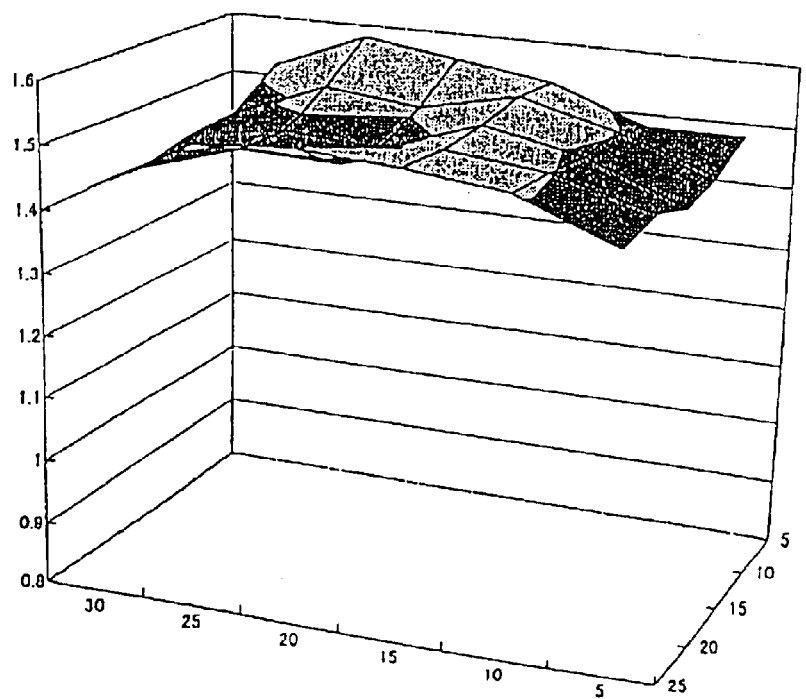
FIG. 32 is a three-dimensional diagram based on results of having measured a state of warp of a substrate used in a memory card available commercially from C company.

Then, as shown in FIG. 11(c), the substrate 6 is positioned with respect to the cap 2 so that the sealing member 5 lies on the lower surface side of the substrate, and is pushed against the cap so that the sealing member 5 and the substrate 6 are fitted in the recess 3. At this time, the adhesive 4 present in the recess 3 of the cap 2 tends to spread with a pressing force exerted thereon from a lower surface of the sealing member 5, but bonding is effected in such a manner that the adhesive 4 which spreads from the deep recess 3b toward the shallow recess 3a is received in the interior of the recess 3, because the amount of the adhesive 4 is set appropriate and the substrate 6 warps arcuately so that its peripheral edges hang down. Therefore, as shown in FIG. 11(d), in a most appropriately controlled state of the amount of adhesive 4 fed, the adhesive 4 lies within the range of the warped surface 6a of the substrate 6 and does not leak to the exterior beyond the peripheral edges of the substrate 6. Consequently, such a raised portion 7 as shown in FIG. 29(d) is no longer formed. After the substrate 6 has been affixed to the cap 2, there is performed a curing treatment for the adhesive 4.

In this way, as shown in FIG. 11(d), there can be fabricated a memory card 1 (an electronic device) in which peripheral edges of the substrate 6 do not project from the recess 3 toward the back surface 2b of the cap 2 and in which a central portion of the substrate 6 warps so as to project in a direction away from the cap 2. Further, the projecting height "g" of the back surface 6b of the substrate 6 from the back surface 2b of the cap 2 is, for example, about 1.490 mm or so, including 1.492, or less, as shown in FIG. 6, thus satisfying the specified range.

Thereafter, a seal 9a is affixed to the surface 2a of the cap 2 to fabricate the memory card 1 shown in FIGS. 2 to 4.

Figure 12:
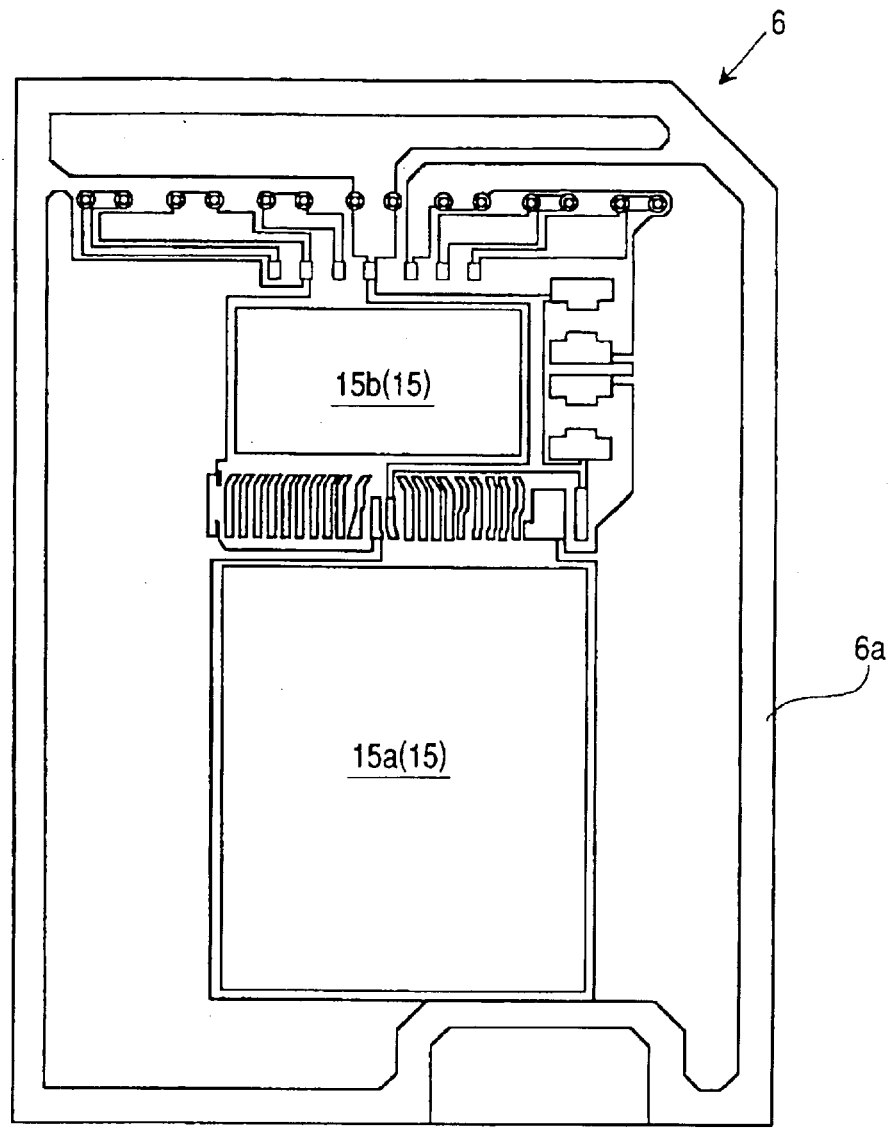
FIG. 12 is a plan view of the substrate with semiconductor chips mounted thereon in manufacturing the memory card of the first embodiment.
Figure 13:
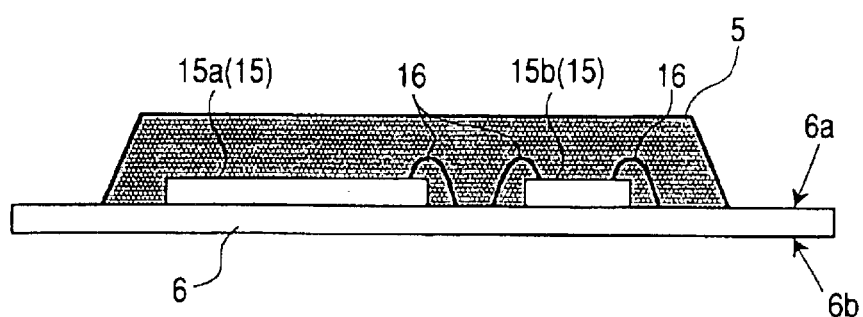
FIG. 13 is a schematic sectional view of the substrate after completion of the mounting of semiconductor chips, wire bonding and the formation of a sealing member in manufacturing the memory card of the first embodiment.

FIGS. 12 and 13 show a concrete example of the memory card of the first embodiment fabricated as above, of which FIG. 12 is a plan view of the substrate after the mounting of semiconductor chips thereon and FIG. 13 is a schematic sectional view of the substrate after the mounting of semiconductor chips, wire bonding and the formation of a sealing member in the manufacture of the memory card.

The surface 6a of the substrate 6 is shown in FIG. 12, with the memory chip 15a and the control chip 15b being fixed thereto. Though not described with reference marks, wiring lines of predetermined patterns are formed on the surface 6a.

After the semiconductor chips 15 have been fixed to the substrate 6, electrodes (not shown) on the semiconductor chips 15 and wiring lines on the surface 6a are electrically connected with each other through wires 16. A sealing member 5 is formed in the area of the predetermined surface 6a including the semiconductor chips 15 and the wires 16. In order to lower the height of the surface of the sealing member 5 from the substrate 6, a recess may be formed in the surface 6a of the substrate 6 and the semiconductor chips 15 may be fixed to the recess.

Figure 19:
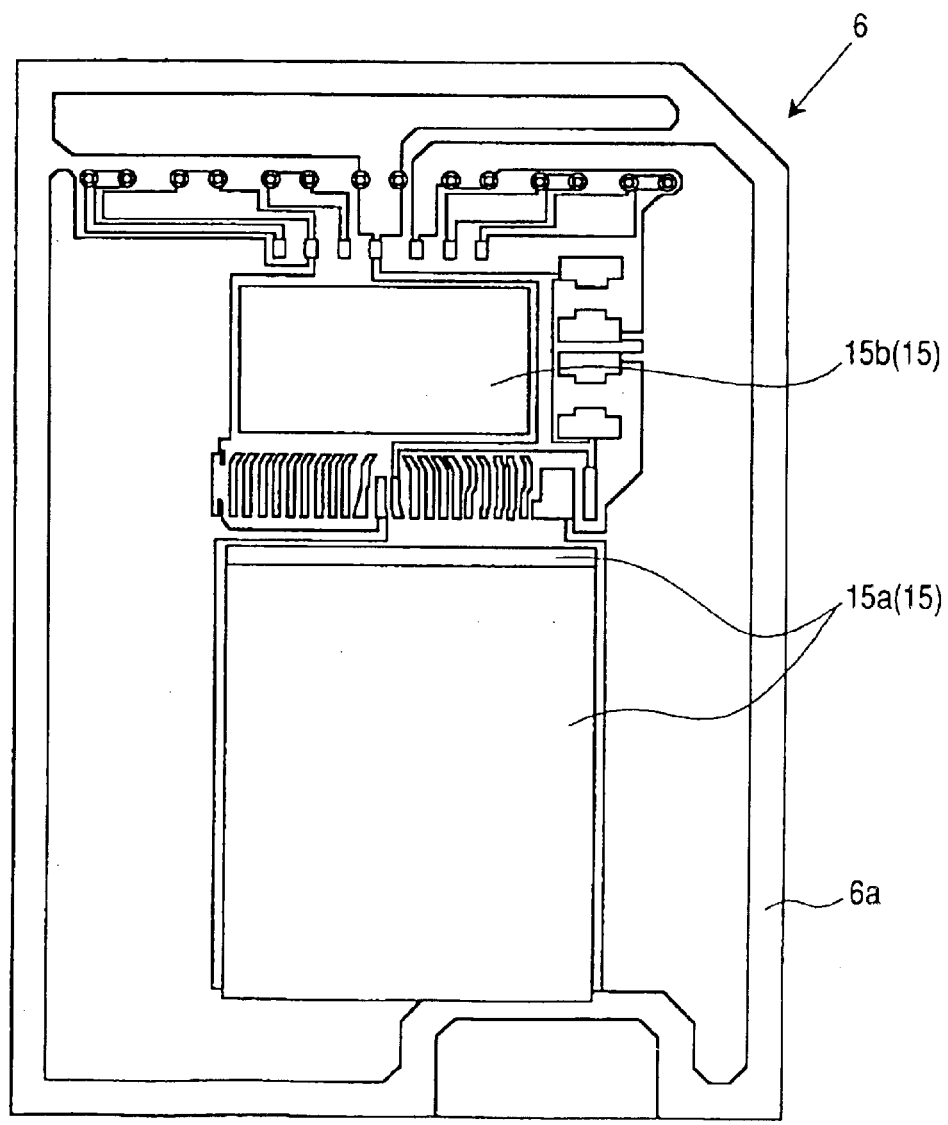
FIG. 19 is a plan view of a substrate after the mounting of semiconductor chips thereon in another example of a memory card in the memory card manufacturing according to the first embodiment.
Figure 20:
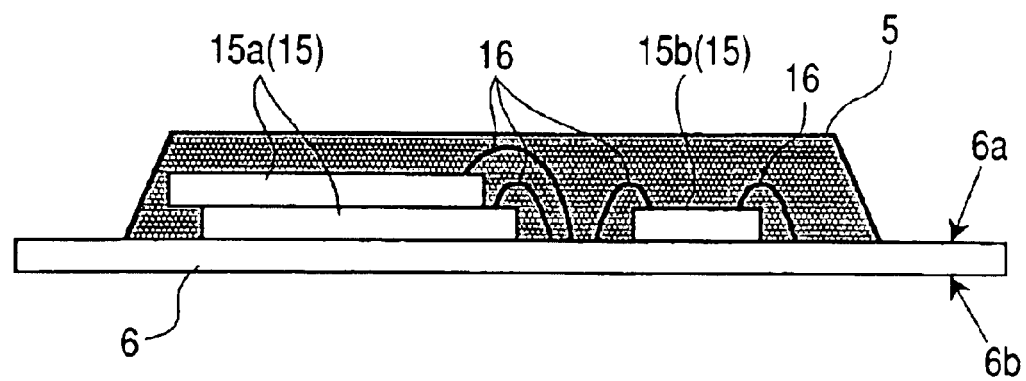
FIG. 20 is a schematic sectional view of the substrate after the mounting of semiconductor chips, wire bonding and the formation of a sealing member in the another example of the memory chip in the memory card manufacturing according to the first embodiment.

FIGS. 19 and 20 show a further concrete example of the memory card of the first embodiment fabricated as above, of which FIG. 19 is a plan view of the substrate after the mounting of semiconductor chips and FIG. 20 is a schematic sectional view of the substrate after the mounting of semiconductor chips, wire bonding and the formation of a sealing member in the manufacture of the memory card.

FIG. 19 shows the surface 6a of the substrate 6, with memory chips 15a and a control chip 15b being fixed thereto. In this example, as is shown more clearly in FIG. 20, memory chips 15a are fixed stackedly in two stages to the substrate 6. In this example, as shown in FIG. 19, after a first memory chip 15a is mounted on the substrate 6, a second memory chip 15a is superimposed and fixed onto the first memory chip 15a in a displaced state. Then, as shown in FIG. 20, electrodes formed on exposed surfaces of the first and second memory chips 15a and wiring lines formed on the substrate 6 are electrically connected with each other through wires 16. According to this example there can be attained a still larger memory capacity. This example is the same as the example shown in FIGS. 12 and 13 except that the semiconductor chip fixing method and the wire bonding method adopted in this example are different from those adopted in the example of FIGS. 12 and 13.

Figure 21:
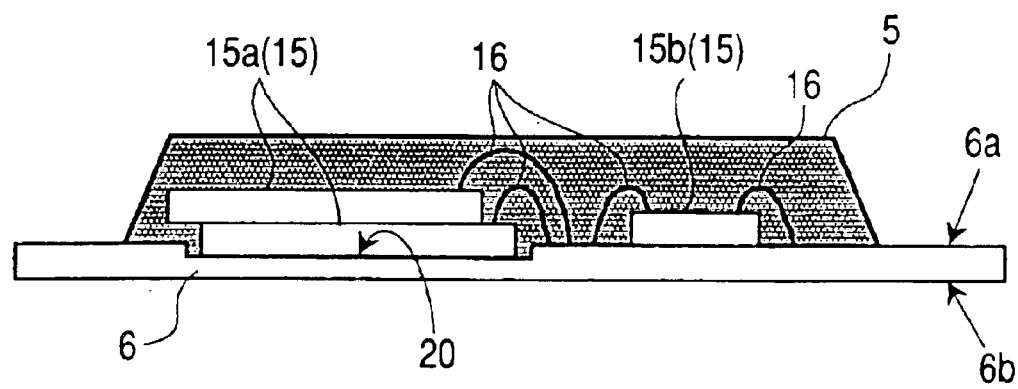
FIG. 21 is a schematic sectional view of a substrate after the mounting of semiconductor chips, wire bonding and the formation of a sealing member in the memory card manufacturing according to the first embodiment.

As shown in FIG. 21, the structure involving the above two-stage fixing of memory chips 15a may be designed such that a recess 20 is formed in the surface 6a of the substrate 6, the first memory chip 15a is fixed to the bottom of the recess, and the second memory chip 15a is fixed onto the first memory chip 15a. By so doing, it is possible to diminish an increase in height of the sealing member 5. In this case, moreover, by adopting a conventional wire lowering technique, it is possible to make the height of the sealing member equal to that of the sealing member formed in a single-stage fixing of memory chip to the substrate.

The following effects are obtained by this first embodiment.

(1) The shallow recess 3a is formed more deeply than the sum of the thickness of the substrate 6 and that of the adhesive 4 which is for bonding the substrate 6 to the bottom of the recess 3, and a thermal expansion coefficient of the material which forms the substrate 6 and that of the material which forms the sealing member 5 are selected appropriately so that the substrate 6 is depressed on its surface 6a side with the sealing member 5 formed thereon and is projected arcuately on its back surface 6b side. Therefore, the peripheral edges of the substrate 6 do not project from the recess (shallow recess 3a) to the back surface 2b side of the cap 2. Thus, such an inconvenience as the memory card 1 being unable to be inserted into a slot of a digital camera or the like does not occur.

(2) The substrate 5 is depressed on its surface 6a side with the sealing member 5 formed thereon, so when the substrate 6 is pushed against the cap 2 at the time of it being affixed to the cap with use of the adhesive 4, the peripheral edges of the substrate surround the adhesive 4 and act to move the adhesive inwards, whereby it is possible to prevent the adhesive 4 from leaking to the back surface 2b side of the cap from the peripheral edges of the substrate 6. Consequently, there does not occur such an inconvenience as the memory card 1 being unable to be inserted into a slot of a digital camera or the like which is caused by leakage of the adhesive 4.

(3) Since the adhesive is positioned inside the peripheral edges of the substrate, the peripheral edges of the substrate do not project to the back surface side of the cap from the interior of the shallow recess of the cap.

(4) Since a thermal expansion coefficient of the substrate 6 and that of the sealing member 5 are selected appropriately and the degree of the substrate warp described above is selected to a predetermined value, the thickness of the memory card 1 also conforms to the specified range.

(5) Through the above effects (1) to (4) the dimensional accuracy of the memory card 1 is improved and it is possible to prevent the formation of a projection or a raised portion of the adhesive 4, so that the quality of the memory card 1 becomes stable and the manufacturing yield is improved, thus permitting the reduction of product costs.

(6) In the construction wherein memory chips are stacked in multiple stages on the substrate, it is possible to attain a large memory capacity. Moreover, the construction wherein semiconductor chips other than memory chips are stacked in multiple stages is suitable also for the attainment of various functions.

(7) According to the construction wherein a recess is formed in the substrate and a semiconductor chip is fixed to the bottom of the recess, it is possible to lower the height of the sealing member and therefore an electronic device such as a memory card can be made thin. Further, according to the construction wherein semiconductor chips are stacked in multiple stages on the bottom of the recess, it is possible to diminish an increase in height of the sealing member. In the case where memory chips are stacked and fixed in two stages onto the bottom of the recess, it is possible, by adopting a wire lowering technique, to make the height of the sealing member equal to that of the sealing member formed in case of fixing a memory chip in one stage onto the substrate.

(8) The closer to the front end in the inserting direction of the memory card 1, the smaller the thickness of the memory card (the distance from the electrode surface to the cap surface) at the portion of external electrode terminals 8b, so that it becomes easier to effect insertion and extraction of the memory card into and from a slot of the type which grips the electrode portion of the memory card with an elastic force.

(Second Embodiment)

Figure 22:
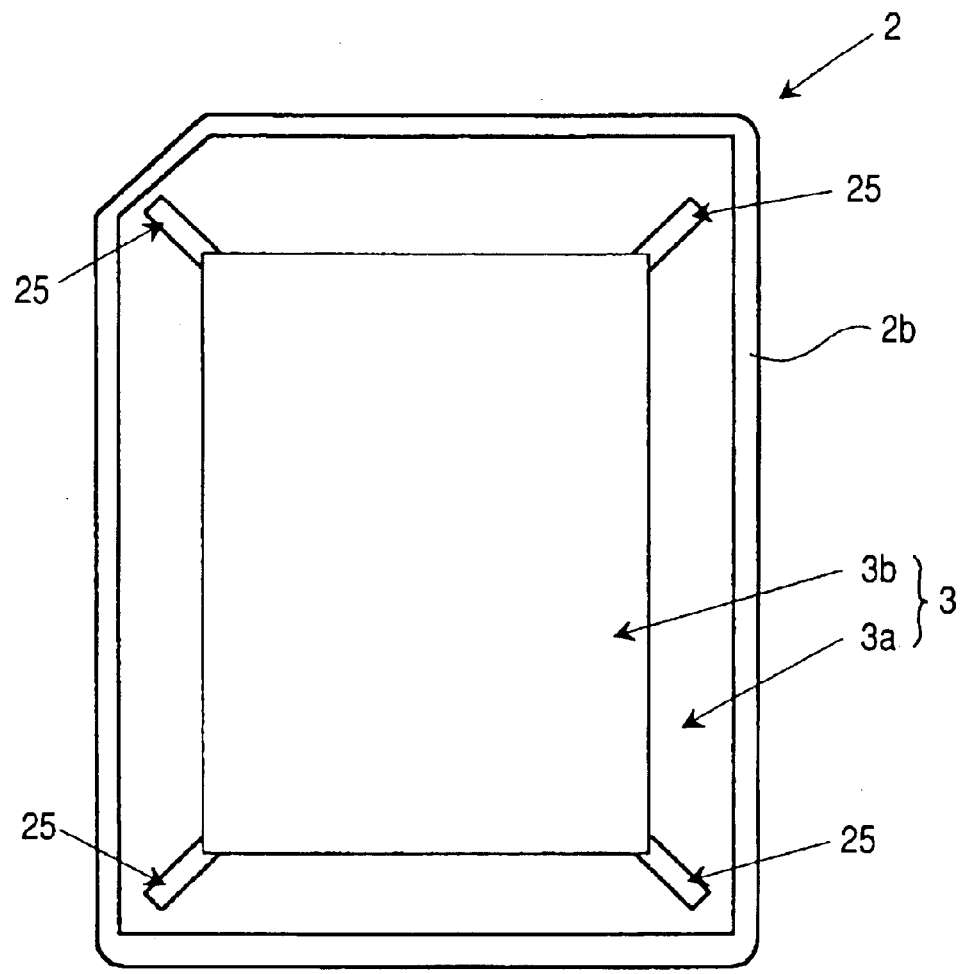
FIG. 22 is a plan view showing a back surface of a cap used in a memory card according to another embodiment (second embodiment) of the present invention.

FIG. 22 is a plan view showing a back surface of a cap used in a memory card according to another embodiment (second embodiment) of the present invention.

In this second embodiment, as shown in FIG. 22, slots 25 are radially formed respectively in corner portions of a shallow recess 3a formed in a back surface 2b of a cap 2. With such radial slots 25 formed in corner portions of the shallow recess 3a of the cap 2, when the substrate 6 is bonded to the cap 2 through the adhesive 4, the slots 25 guide the adhesive 4 into the shallow recess 3a more uniformly, whereby the bonding strength of the substrate 6 and the reliability of the bonding are improved.

(Third Embodiment)

Figure 23:
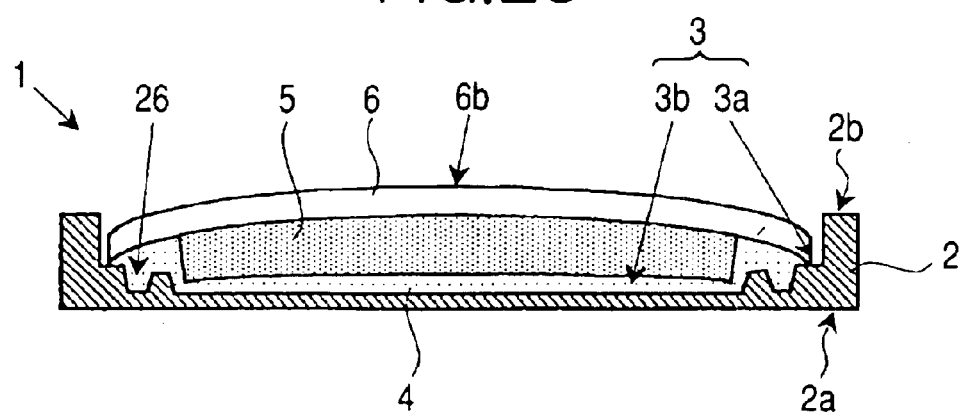
FIG. 23 is an exaggerated schematic sectional view of a memory card according to a further embodiment (third embodiment) of the present invention.

FIG. 23 is an exaggerated schematic sectional view of a memory card according to a further embodiment (third embodiment) of the present invention.

In this third embodiment, as shown in FIG. 23, a slot 26 is formed in a bottom of a shallow recess 3a of a cap 2 so as to surround a deep recess 3b of the cap. The bottom portion of the shallow recess 3a located between the slot 26 and the deep recess 3b is slightly lower, e.g., 40 to 70 µm lower, than the bottom portion of the shallow recess located outside the slot 26.

By thus forming the slot 26 in the bottom of the shallow recess 3a of the cap so as to surround the deep recess 3b, the adhesive 4 overflowing from the deep recess 3b can be allowed to stay within the slot 26 at the time of bonding the substrate 6 to the cap 2 through the adhesive 4. Consequently, the adhesive 4 does not leak to the exterior of the cap 2 from peripheral edges of the substrate 6. Coupled with the effects obtained in the first embodiment, a raised portion of the adhesive is no longer formed.

(Fourth Embodiment)

Figure 24:
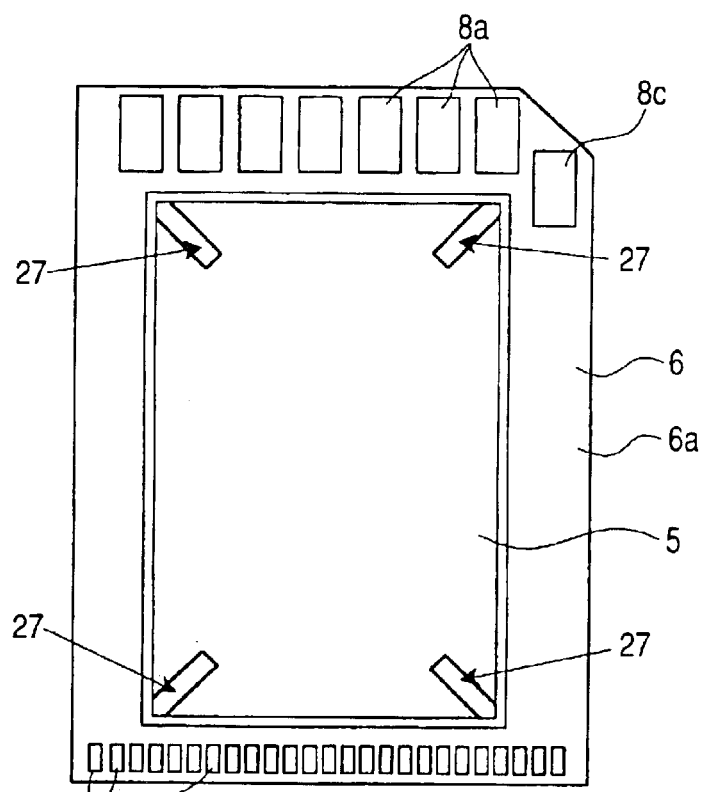
FIG. 24 is a bottom view showing a back surface of a substrate having a sealing member used in a memory card according to a still further embodiment (fourth embodiment) of the present invention.
Figure 25:
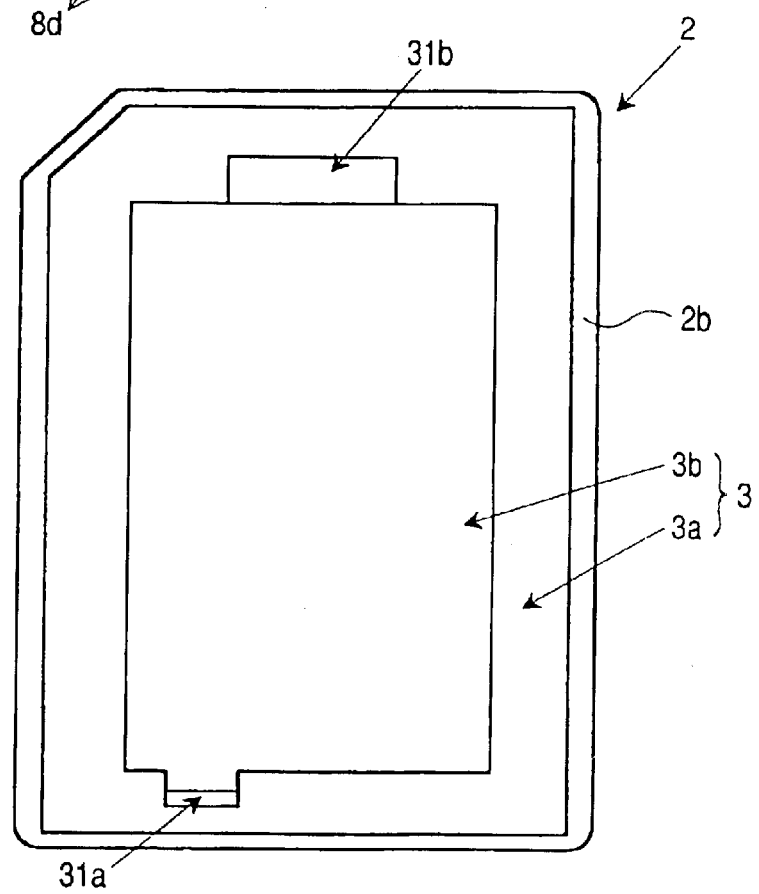
FIG. 25 is a plan view showing a back surface of a cap used in a memory card according to a still further embodiment (fifth embodiment) of the present invention.

FIG. 24 is a bottom view of showing a back surface of a substrate having a sealing member in a memory card according to a still further embodiment (fourth embodiment) of the present invention.

In this fourth embodiment, plural slots 27 which extend radially from inside to outside are formed in a surface of a sealing member 5 formed on a surface 6a of a substrate 6, the surface of the sealing member 5 confronting a bottom of a recess 3 (deep recess 3b).

With the slots 27 formed radially in the surface of the sealing member 5, when the substrate 6 is bonded to a cap 2 through the adhesive 4, the adhesive can be guided more uniformly not only into the deep recess 3b but also into the shallow recess 3a, whereby the bonding strength of the substrate 6 and the reliability of the bonding are improved.

Although in the figure the slots 27 are formed at four corners of the sealing member 5, such slots may be formed also in side portions in addition to the corner slots, whereby the adhesive 4 can be dispersed uniformly throughout the whole of the outer periphery of the recess.

(Fifth Embodiment)

Figure 26:
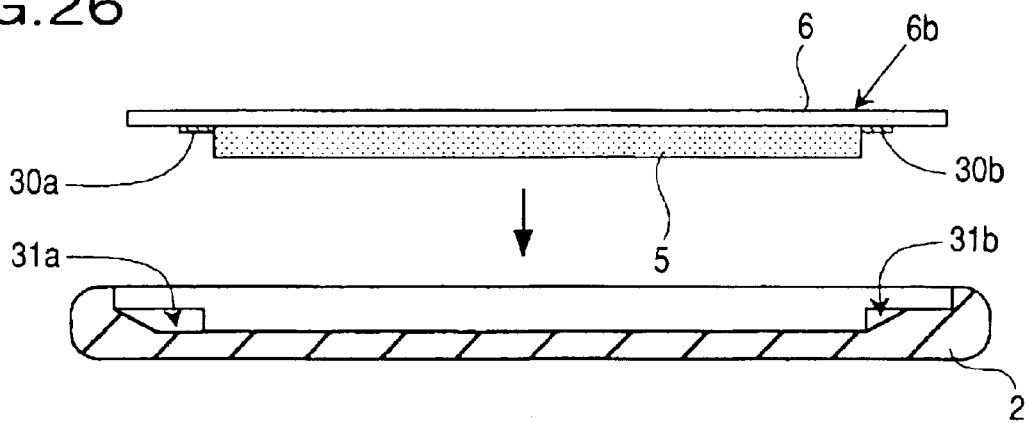
FIG. 26 is a schematic sectional view showing in what state a substrate is affixed to the cap in the memory card of the fifth embodiment.

FIG., 25 is a plan view showing a back surface of a cap used in a memory card according to a still further embodiment (fifth embodiment) of the present invention and FIG. 26 is a schematic sectional view showing in what state a substrate of the memory card is affixed to a cap.

As shown in FIG. 26, there sometimes occurs a case where resin portions (burrs) 30a and 30b remain in a sealing member 5 without being removed in portions of a shallow recess 3a of the cap 2 which portions correspond respectively to a gate area and an air vent area of the sealing member 5 formed by transfer molding. In this fifth embodiment, in order to prevent contact of the resin portions (burrs) 30a and 30b with an inner surface of a cap 2, recesses 31a and 31b are formed in portions of a shallow recess 3a of the cap 2 which portions correspond respectively to a gate area and an air vent area of the sealing member formed by transfer molding.

That is, in the case where the sealing member 5 is formed by transfer molding, recesses 31a and 31b as relief recesses are formed in the shallow recess 3a of the cap 2 at positions corresponding to a gate area and an air vent area, and at the time of affixing the substrate 6 to the cap 2, the resin portion 30a which has cured in the gate area and the resin portion 30b which has cured in the air vent area, both remaining in the sealing member 5, are prevented from contacting bottoms of the recesses 31a and 31b, thereby allowing the substrate 6 to be bonded positively to the adhesive 4. As a result, the substrate 6 is prevented from tilting and the yield is improved.

(Sixth Embodiment)

Figure 27:
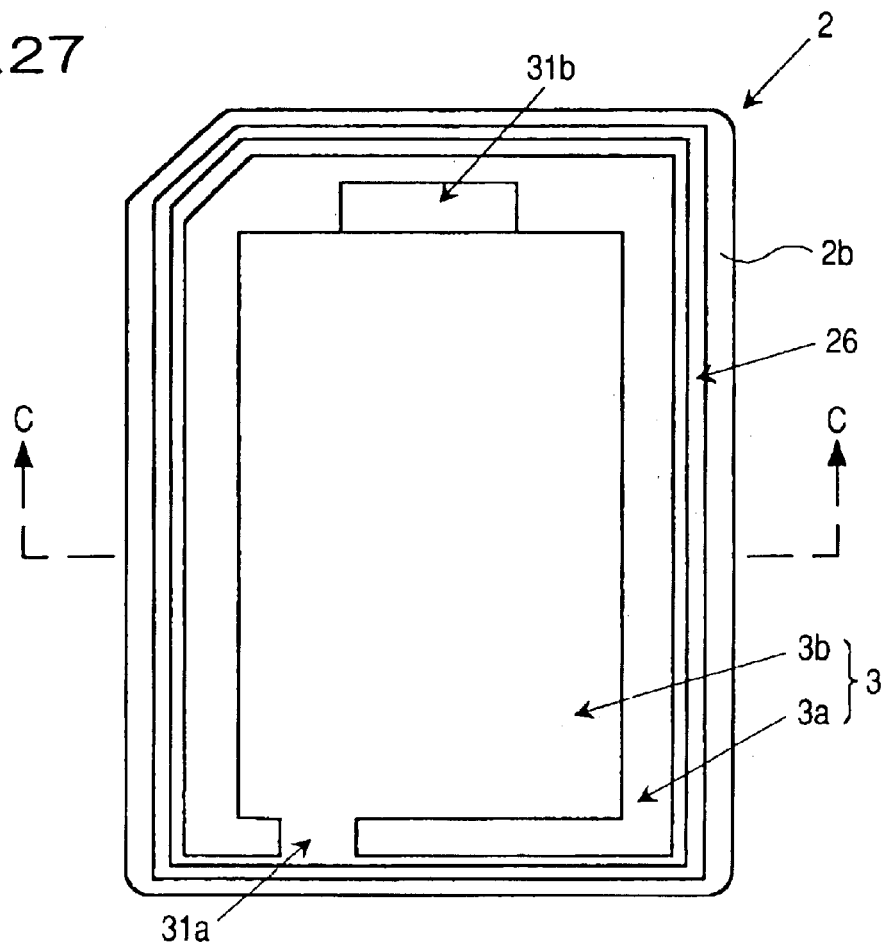
FIG. 27 is a plan view showing a back surface of a cap used in a memory card according to a still further embodiment (sixth embodiment) of the present invention.
Figure 28:
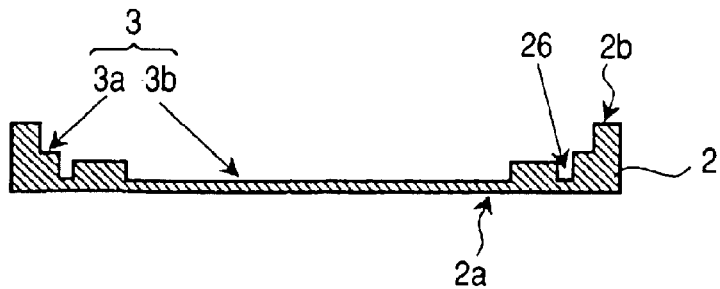
FIG. 28 is a sectional view taken alone line C—C in FIG. 27.

FIG. 27 is a plan view showing a back surface of a cap used in a memory card according to a still further embodiment (sixth embodiment) of the present invention and FIG. 28 is a sectional view taken along line C—C in FIG. 27.

This sixth embodiment has a construction in which a slot 26 is formed in the bottom of the shallow recess 3a of the cap in the third embodiment so as to surround the deep recess 3b, allowing extra adhesive 4 flowing out from the deep recess 3b to stay in the slot 26 and thereby preventing the extra adhesive 4 from flowing out to the exterior of the cap 2 past the peripheral edges of the substrate 6. The sixth embodiment also has a construction in which recesses 31a and 31b are formed in the shallow recess 3a of the cap 2 used in the fifth embodiment, thereby permitting the substrate 6 to be bonded to the cap 2 positively even with resin portions (burrs) 30a and 30b remaining in the sealing member 5. With these constructions, the manufacturing yield for the memory card 1 is improved and it becomes possible to attain the reduction of cost.

The following is a brief description of effects obtained by typical modes of the present invention as disclosed herein.

(1) According to the structure wherein the substrate is affixed through an adhesive to a recess formed in the back surface of the cap, it is possible to provide an electronic device wherein substrate edges do not project from the back surface of the cap, as well as a method of manufacturing the same.

(2) According to the structure wherein the substrate is affixed through an adhesive to a recess formed in the back surface of the cap, it is possible to provide a memory card wherein substrate edges do not project from the back surface of the cap, as well as a method of manufacturing the same.

(3) According to the structure wherein the substrate is affixed through an adhesive to a recess formed in the back surface of the cap, it is possible to provide an electronic device wherein the adhesive does not flow out to the back surface of the cap, as well as a method of manufacturing the same.

(4) According to the structure wherein the substrate is affixed through an adhesive to a recess formed in the back surface of the cap, it is possible to provide a memory card wherein the adhesive does not leak out to the back surface of the cap, as well as a method of manufacturing the same.

INDUSTRIAL APPLICABILITY

Although the present invention has been described above concretely by way of embodiments thereof, it goes without saying that the invention is not limited to the above embodiments, but that various changes may be made within the scope not departing from the gist of the invention.

Although the present invention has been described above mainly about examples in which the invention is applied to memory cards as a background application field of the invention, it is needless to say that the invention is also applicable to other electronic devices than memory cards. For example, the present invention is also applicable to such card products as ROM (Read Only Memory) card, RAM (Random Access Memory) card, and IC card incorporating memory and CPU. Even in such applications there will be obtained the same effects as in the above embodiments.

The present invention is applicable at least to manufacturing electronic devices of the structure wherein a substrate is fixed to a cap using an adhesive.

What is claimed is:

1. A memory card, comprising:
a substrate having wiring lines;
at least one semiconductor chip fixed to a surface of the substrate and having predetermined electrodes connected electrically to the wiring lines on the substrate;

a sealing member formed of an insulating resin over the surface of the substrate to cover a predetermined area including the semiconductor chip; and a cap having a recess formed in a back surface thereof, the sealing member on the substrate being received in the recess of the cap and the substrate being affixed to the cap through an adhesive, wherein peripheral edges of the substrate do not project from the recess to the back surface of the cap, and a central portion of the substrate warps so as to project in a direction away from the cap.

2. The memory card according to claim 1, wherein the peripheral edges of the substrate are retracted into the recess with respect to a surface of the cap.

3. The memory card according to claim 1, wherein the recess comprises a shallow recess for fitting therein the substrate and a deep recess formed in a bottom of the shallow recess for fitting therein the sealing member, the substrate is fitted in the shallow recess and is affixed to the bottom of the shallow recess through the adhesive, and the sealing member is affixed to a bottom of the deep recess through the adhesive.

4. The memory card according to claim 3, wherein the shallow recess is deeper than the sum of the thickness of the substrate and the thickness of the adhesive which is for bonding the substrate to the bottom of the shallow recess, and the peripheral edges of the substrate are retracted into the shallow recess without projecting from the back surface of the cap.

5. The memory card according to claim 3, wherein the substrate is quadrangular in shape and the central portion thereof projects higher than side portions thereof.

6. The memory card according to claim 3, wherein the substrate is quadrangular in shape and the central portion thereof projects higher than corner portions thereof.

7. The memory card according to claim 3, wherein slots are radially formed respectively in corner portions of the shallow recess of the cap.

8. The memory card according to claim 3, wherein a slot is formed in the bottom of the shallow recess of the cap so as to surround the deep recess of the cap, and the bottom portion of the shallow recess located between the slot and the deep recess is lower than the bottom portion of the shallow recess located outside the slot.

9. The memory card according to claim 1, wherein when the substrate is divided into three equal portions lengthwise and crosswise and when the central portion and portions spreading around the central portion are a central area and peripheral areas, respectively, a highest projecting portion of the central area is higher than highest projecting portions respectively of the peripheral areas.

10. The memory card according to claim 1, wherein when the substrate is divided into three equal portions lengthwise and crosswise and when the central portion and portions spreading around the central portion are a central area and peripheral areas, respectively, a lowest projecting portion in the central area projects higher than a highest peripheral edge portion of the substrate.

11. The memory card according to claim 1, wherein when the substrate is divided into three equal portions lengthwise and crosswise and when the central portion and portions spreading around the central portion are a central area and peripheral areas, respectively, a mean value of a projecting height in the central area is larger than a mean value of projecting heights in the peripheral areas.

12. The memory card according to claim 1, wherein a thermal expansion coefficient of the resin which forms the sealing member is larger than that of the substrate.

13. The memory card according to claim 1, wherein the resin which forms the sealing member has a thermal expansion coefficient in the range of about $9 \times 10^{-6}/°$ C. to about $16 \times 10^{-6}/°$ C., and the substrate is formed by a glass fabric-based epoxy resin board having a thermal expansion coefficient in the range of $1.3 \times^{-5}/°$ C. to $1.6 \times 10^{-5}/°$ C.

14. The memory card according to claim 1, wherein the semiconductor chip is affixed to a bottom of the recess formed in the cap.

15. The memory card according to claim 1, wherein the cap is in the form of a card having a thickness of several millimeters and, as the semiconductor chips, a memory chip and a control chip for controlling the memory chip are incorporated in the sealing member to constitute a memory card.

16. The memory card according to claim 15, wherein the memory chip comprises a first memory chip mounted on the substrate and a second memory chip superimposed and fixed onto the first memory chip in a displaced state.

17. The memory card according to claim 1, wherein a plurality of slots extending from inside to outside are formed in a surface of the sealing member which surface confronts a bottom of the recess.

18. The memory card according to claim 1, wherein recesses are formed respectively in shallow recess portions of the cap at positions corresponding to a gate area and an air vent area of the sealing member which is formed by transfer molding.

19. A memory card, comprising:

a substrate having wiring lines;

at least one semiconductor chip fixed to a surface of the substrate and having predetermined electrodes connected electrically to wiring lines of the substrate;

a sealing member formed of an insulating resin on the surface of the substrate to cover a predetermined area including the semiconductor chip; and a cap having a recess formed in a back surface thereof which recess permits the substrate and the sealing member to be received therein, the sealing member on the substrate being received in the recess of the cap and the substrate being affixed on a surface side to the cap through an adhesive, wherein the recess comprises a shallow recess for fitting therein the substrate and a deep recess formed in a bottom of the shallow recess for fitting therein the sealing member, the substrate is fitted in the shallow recess and is affixed to the bottom of the shallow recess through the adhesive, and the sealing member is affixed to a bottom of the deep recess through the adhesive, wherein peripheral edges of the substrate do not project from the shallow recess to the back surface of the cap, wherein the adhesive is positioned inside the peripheral edges of the substrate, and wherein the substrate is warped so that a central portion thereof projects in a direction away from the cap.

20. The memory card according to claim 19, wherein the cap is a thin card and constitutes a memory card.

21. A memory card, comprising:

a substrate having a main surface and a back surface;

a semiconductor chip formed over said main surface of said substrate;

a sealing member formed over said main surface of said substrate and covering said semiconductor chip; and a cap having a main surface and a back surface, and said back surface of said cap having a recess;

wherein a part of said substrate and said sealing member are fitted in said recess, and wherein the distance between a central portion of said substrate and said main surface of said cap is greater than the distance between an edge portion of said substrate and said main surface of said cap.

22. A memory card according to the claim 21, further comprising:

an adhesive formed between said substrate and said back surface of said cap, and between said sealing member and said back surface of said cap, respectively.

23. A memory card according to the claim 21, wherein said sealing member is formed of a resin.

24. A memory card according to the claim 21, wherein said sealing member is formed of an insulation film.

25. A memory card according to the claim 21, wherein a thermal expansion coefficient of said sealing member is larger than that of said substrate.

26. A memory card according to the claim 21, wherein said sealing member is formed of a resin having a thermal expansion coefficient in the range of about $9 \times 10^{-5}/^\circ C.$ to about $16 \times 10^{-5}/^\circ C.$, and wherein said substrate is formed of a glass fabric-based epoxy resin having a thermal expansion coefficient in the range of $1.3 \times 10^{-5}/^\circ C.$ to $1.6 \times 10^{-5}/^\circ C.$ 27. A memory card according to the claim 21, wherein said substrate is warped so that said central portion of said substrate projects in a direction away from said cap.

28. A memory card according to the claim 27, wherein said edge portion of said substrate is put in contact with the bottom of said recess.

29. A memory card according to the claim 21, wherein said semiconductor chip is a flash memory chip.

30. A memory card according to the claim 29, further comprising:

a control chip formed over said main surface of said substrate and having circuits for controlling said flash memory chip, wherein said sealing member covers said flash memory chip and said control chip.

31. A memory card, comprising:

a substrate having a main surface and a back surface;

a semiconductor chip formed over said main surface of said substrate;

a sealing member formed over said main surface of said substrate and covering said semiconductor chip; and a cap having a main surface and a back surface, and said back surface of said cap having a first recess and a second recess;

wherein the depth of said first recess is deeper than the depth of said second recess, wherein a part of said substrate is filled in said second recess, wherein said sealing member is fitted in said first recess, and wherein said substrate is warped so that a central portion of said substrate projects in a direction away from said cap.

32. A memory card according to the claim 31, further comprising:

an adhesive formed between said substrate and said back surface of said cap, and between said sealing member and said back surface of said cap, respectively.

33. A memory card according to the claim 32], wherein the depth of said first recess is larger than the sum of the thickness of said substrate and the thickness of said adhesive which is bonding said substrate to the bottom of said first recess.

34. A memory card according to the claim 31, wherein said sealing member is formed of a resin.

35. A memory card according to the claim 31, wherein said sealing member is formed of an insulation film.

36. A memory card according to the claim 31, wherein a thermal expansion coefficient of said sealing member is larger than that of said substrate.

37. A memory card according to the claim 31, wherein said sealing member is formed of a resin having a thermal expansion coefficient in the range of about $9 \times 10^{-6}/^\circ C.$ to about $16 \times 10^{-6}/^\circ C.$, and wherein said substrate is formed of a glass fabric-based epoxy resin having a thermal expansion coefficient in the range of $1.3 \times 10^{-5}/^\circ C.$ to $1.6 \times 10^{-5}/^\circ C.$ 38. A memory card according to the claim 31, wherein an edge portion of said substrate is put in contact with the bottom of said second recess.

39. A memory card according to the claim 31, wherein said semiconductor chip is a flash memory chip.

40. A memory card according to the claim 39, further comprising:

a control chip formed over said main surface of said substrate and having circuits for controlling said flash memory chip, wherein said sealing member covers said flash memory chip and said control chip.

41. A memory card, comprising:

a substrate having a main surface and a back surface;

a semiconductor chip formed over said main surface of said substrate;

a sealing member formed over said main surface of said substrate and covering said semiconductor chip; and a cap having a main surface and a back surface, and said back surface of said cap having a first recess and a second recess;

wherein the depth of said first recess is deeper than the depth of said second recess, wherein said substrate is fitted in said second recess, wherein said sealing member is fitted in said first recess, and wherein a thermal expansion coefficient of said sealing member is larger than that of said substrate.

42. A memory card according to the claim 41, further comprising:

an adhesive formed between said substrate and said back surface of said cap, and between said sealing member and said back surface of said cap, respectively.

43. A memory card according to the claim 42, wherein the depth of said first recess is larger than the sum of the thickness of said substrate and the thickness of said adhesive which is bonding said substrate to the bottom of said first recess.

44. A memory card according to the claim 41, wherein said sealing member is formed of a resin.

45. A memory card according to the claim 41,
wherein said sealing member is formed of an insulation film.

46. A memory card according to the claim 41, wherein an edge portion of said substrate is put in contact with the bottom of said second recess.

47. A memory card according to the claim 41, wherein said semiconductor chip is a flash memory chip.

48. A memory card according to the claim 47, further comprising:
a control chip formed over said main surface of said substrate and having circuits for controlling said flash memory chip,
wherein said sealing member covers said flash memory chip and said control chip.

49. A memory card, comprising:
a substrate having a main surface and a back surface;
a semiconductor chip formed over said main surface of said substrate;
a sealing member formed over said main surface of said substrate and covering said semiconductor chip; and
a cap having a main surface and a back surface, and said back surface of said cap having a recess;
wherein said substrate and said sealing member are fitted in said recess, and
wherein said substrate is warped so that a central portion of said substrate projects in a direction away from said cap.

* * * * *